United States Patent
Jacobs, II

(10) Patent No.: US 10,162,337 B2
(45) Date of Patent: *Dec. 25, 2018

(54) NATURAL LANGUAGE USER INTERFACE FOR COMPUTER-AIDED DESIGN SYSTEMS

(71) Applicant: Desprez, LLC, New London, NH (US)

(72) Inventor: James L. Jacobs, II, Amherst, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/787,423

(22) Filed: Oct. 18, 2017

(65) Prior Publication Data

US 2018/0039253 A1    Feb. 8, 2018

Related U.S. Application Data

(63) Continuation-in-part of application No. 15/388,940, filed on Dec. 22, 2016, which is a continuation of application No. 14/486,550, filed on Sep. 15, 2014, now Pat. No. 9,613,020.

(51) Int. Cl.
*G10L 15/00*    (2013.01)
*G05B 19/4093*    (2006.01)
(Continued)

(52) U.S. Cl.
CPC ......... *G05B 19/4093* (2013.01); *G06F 17/50* (2013.01); *G10L 15/22* (2013.01); *G10L 15/00* (2013.01); *G10L 2015/223* (2013.01)

(58) Field of Classification Search
CPC ......... G10L 15/00; G10L 15/22; G10L 15/26; G10L 15/265; G05B 19/4093;
(Continued)

(56) References Cited

U.S. PATENT DOCUMENTS

| 4,495,559 A | 1/1985 | Gelatt, Jr. et al. |
| 5,117,354 A | 5/1992 | Long |

(Continued)

FOREIGN PATENT DOCUMENTS

| CN | 2112190 U | 8/1992 |
| WO | 154476 A2 | 8/2001 |

(Continued)

OTHER PUBLICATIONS

Kou, X. Y., S. K. Xue, and S. T. Tan. "Knowledge-guided inference for voice-enabled CAD." Computer-Aided Design 42.6 (2010): 545-557.*

(Continued)

*Primary Examiner* — Paras D Shah
(74) *Attorney, Agent, or Firm* — Caldwell Intellectual Property Law

(57) ABSTRACT

A method of providing a natural language interface for a computer-aided design (CAD) system is disclosed. The method includes displaying to the user a model display graphical user interface (GUI), a view window that displays a first view of the CAD model, and a spectrum GUI configured to allow the user to selectively add CAD-tool functionality, receiving a voice input including a plurality of words and referring to a CAD-tool functionality, parsing the voice input, determining a meaning including a reference to the CAD-tool functionality for the parsed voice input, assembling a query for additional information based on the meaning, sending the assembled query to a corresponding information location, receiving queried information from the corresponding information location, translating received information into a response, determining that the response includes a command for the spectrum GUI regarding the CAD-tool functionality, and sending the command to the spectrum GUI.

16 Claims, 14 Drawing Sheets

(51) Int. Cl.
*G06F 17/27* (2006.01)
*G06F 17/50* (2006.01)
*G10L 15/22* (2006.01)

(58) Field of Classification Search
CPC .......... G05B 19/4099; G05B 19/40931; G05B
19/40932; G05B 19/40933; G05B
19/40935; G05B 19/40936; G05B
19/40938; G05B 19/4097; G05B
2219/13139; G05B 2219/23005; G05B
2219/23007; G05B 2219/23011; G05B
2219/23012
USPC .................... 704/275; 700/182, 98; 715/964
See application file for complete search history.

(56) References Cited

U.S. PATENT DOCUMENTS

| | | | |
|---|---|---|---|
| 5,465,221 A | 11/1995 | Merat et al. | |
| 5,495,430 A | 2/1996 | Matsunari et al. | |
| 5,552,995 A | 9/1996 | Sebastian | |
| 5,570,291 A | 10/1996 | Dudle et al. | |
| 5,655,087 A | 8/1997 | Hino et al. | |
| 5,758,328 A | 5/1998 | Giovannoli | |
| 5,847,971 A | 12/1998 | Ladner et al. | |
| 5,870,719 A | 2/1999 | Maritzen et al. | |
| 5,937,189 A | 8/1999 | Branson et al. | |
| 6,031,535 A | 2/2000 | Barton | |
| 6,112,133 A | 8/2000 | Fishman | |
| 6,295,513 B1 | 9/2001 | Thackston | |
| 6,341,271 B1 | 1/2002 | Salvo et al. | |
| 6,343,285 B1 | 1/2002 | Tanaka et al. | |
| 6,611,725 B1* | 8/2003 | Harrison | G06T 19/00 345/420 |
| 6,647,373 B1 | 11/2003 | Carlton-Foss | |
| 6,701,200 B1 | 3/2004 | Lukis et al. | |
| 6,750,864 B1 | 6/2004 | Anwar | |
| 6,834,312 B2 | 12/2004 | Edwards et al. | |
| 6,836,699 B2 | 12/2004 | Lukis et al. | |
| 6,859,768 B1 | 2/2005 | Wakelam et al. | |
| 6,922,701 B1 | 6/2005 | Ananian et al. | |
| 6,917,847 B2 | 7/2005 | Littlejohn et al. | |
| 7,006,084 B1 | 2/2006 | Buss et al. | |
| 7,058,465 B2 | 6/2006 | Emori et al. | |
| 7,079,990 B2 | 7/2006 | Haller et al. | |
| 7,085,687 B2 | 8/2006 | Eckenwiler et al. | |
| 7,089,082 B1 | 8/2006 | Lukis et al. | |
| 7,123,986 B2 | 10/2006 | Lukis et al. | |
| 7,134,096 B2 | 11/2006 | Brathwaite et al. | |
| 7,299,101 B2 | 11/2007 | Lukis et al. | |
| 7,305,367 B1 | 12/2007 | Hollis et al. | |
| 7,327,869 B2 | 2/2008 | Boyer | |
| 7,343,212 B1 | 3/2008 | Brearley et al. | |
| 7,359,886 B2 | 4/2008 | Sakurai et al. | |
| 7,366,643 B2 | 4/2008 | Verdura et al. | |
| 7,369,970 B2 | 5/2008 | Shimizu et al. | |
| 7,418,307 B2 | 8/2008 | Katircioglu | |
| 7,467,074 B2 | 12/2008 | Faruque et al. | |
| 7,496,487 B2 | 2/2009 | Wakelam et al. | |
| 7,496,528 B2 | 2/2009 | Lukis et al. | |
| 7,499,871 B1 | 3/2009 | McBrayer et al. | |
| 7,523,411 B2 | 4/2009 | Carlin | |
| 7,526,358 B2 | 4/2009 | Kawano et al. | |
| 7,529,650 B2 | 5/2009 | Wakelam et al. | |
| 7,565,139 B2 | 7/2009 | Neven, Sr. et al. | |
| 7,565,223 B2 | 7/2009 | Moldenhauer et al. | |
| 7,567,849 B1 | 7/2009 | Trammell et al. | |
| 7,568,155 B1 | 7/2009 | Axe et al. | |
| 7,571,166 B1 | 8/2009 | Davies et al. | |
| 7,574,339 B2 | 8/2009 | Lukis et al. | |
| 7,590,466 B2 | 9/2009 | Lukis et al. | |
| 7,590,565 B2 | 9/2009 | Ward et al. | |
| 7,603,191 B2 | 10/2009 | Gross | |
| 7,606,628 B2 | 10/2009 | Azuma | |
| 7,630,783 B2 | 12/2009 | Walls-Manning et al. | |
| 7,656,402 B2 | 2/2010 | Abraham et al. | |
| 7,689,936 B2 | 3/2010 | Rosel | |
| 7,733,339 B2 | 6/2010 | Laning et al. | |
| 7,747,469 B2 | 6/2010 | Hinman | |
| 7,748,622 B2 | 7/2010 | Schon et al. | |
| 7,761,319 B2 | 7/2010 | Gil et al. | |
| 7,822,682 B2 | 10/2010 | Arnold et al. | |
| 7,836,573 B2 | 11/2010 | Lukis et al. | |
| 7,840,443 B2 | 11/2010 | Lukis et al. | |
| 7,908,200 B2 | 3/2011 | Scott et al. | |
| 7,957,830 B2 | 6/2011 | Lukis et al. | |
| 7,979,313 B1 | 7/2011 | Baar | |
| 7,993,140 B2 | 8/2011 | Sakezles | |
| 8,000,987 B2 | 8/2011 | Hickey et al. | |
| 8,024,207 B2 | 9/2011 | Ouimet | |
| 8,140,401 B2 | 3/2012 | Lukis et al. | |
| 8,170,946 B2 | 5/2012 | Blair et al. | |
| 8,175,933 B2 | 5/2012 | Cook, Jr. et al. | |
| 8,180,396 B2 | 5/2012 | Athsani et al. | |
| 8,209,327 B2 | 6/2012 | Danish et al. | |
| 8,239,284 B2 | 8/2012 | Lukis et al. | |
| 8,249,329 B2 | 8/2012 | Silver | |
| 8,271,118 B2 | 9/2012 | Pietsch et al. | |
| 8,275,583 B2 | 9/2012 | Devarajan et al. | |
| 8,295,971 B2 | 10/2012 | Krantz | |
| 8,417,478 B2 | 4/2013 | Gintis et al. | |
| 8,441,502 B2 | 5/2013 | Reghetti et al. | |
| 8,515,820 B2 | 8/2013 | Lopez et al. | |
| 8,554,250 B2 | 10/2013 | Linaker | |
| 8,571,298 B2 | 10/2013 | McQueen et al. | |
| 8,595,171 B2 | 11/2013 | Qu | |
| 8,700,185 B2 | 4/2014 | Yucel et al. | |
| 8,706,607 B2 | 4/2014 | Sheth et al. | |
| 8,768,651 B2 | 7/2014 | Bhaskaran et al. | |
| 8,798,324 B2 | 8/2014 | Conradt | |
| 8,806,398 B2 | 8/2014 | Brathwaite et al. | |
| 8,830,267 B2 | 9/2014 | Brackney | |
| 8,849,636 B2 | 9/2014 | Becker et al. | |
| 8,861,005 B2 | 10/2014 | Grosz | |
| 8,874,413 B2 | 10/2014 | Mulligan et al. | |
| 8,923,650 B2 | 12/2014 | Wexler | |
| 8,977,558 B2 | 3/2015 | Nielsen et al. | |
| 9,037,692 B2 | 5/2015 | Ferris | |
| 9,055,120 B1 | 6/2015 | Firman | |
| 9,106,764 B2 | 8/2015 | Chan et al. | |
| 2001/0023418 A1 | 9/2001 | Suzuki et al. | |
| 2001/0047251 A1 | 11/2001 | Kemp | |
| 2002/0065790 A1 | 5/2002 | Oouchi | |
| 2002/0087440 A1 | 7/2002 | Blair et al. | |
| 2002/0099579 A1 | 7/2002 | Stowell et al. | |
| 2002/0107673 A1 | 8/2002 | Haller et al. | |
| 2002/0152133 A1 | 10/2002 | King et al. | |
| 2003/0018490 A1 | 1/2003 | Magers et al. | |
| 2003/0069824 A1 | 4/2003 | Menninger | |
| 2003/0078846 A1 | 4/2003 | Burk et al. | |
| 2003/0139995 A1 | 7/2003 | Farley | |
| 2003/0149500 A1 | 8/2003 | Faruque et al. | |
| 2003/0163212 A1 | 8/2003 | Smith et al. | |
| 2003/0172008 A1 | 9/2003 | Hage et al. | |
| 2003/0212610 A1 | 11/2003 | Duffy et al. | |
| 2003/0220911 A1* | 11/2003 | Tompras | G06F 17/50 |
| 2004/0008876 A1* | 1/2004 | Lure | G06F 19/3406 382/128 |
| 2004/0113945 A1 | 6/2004 | Park et al. | |
| 2004/0195224 A1 | 10/2004 | Kanodia et al. | |
| 2005/0055299 A1 | 3/2005 | Chambers et al. | |
| 2005/0125092 A1 | 6/2005 | Lukis et al. | |
| 2005/0144033 A1 | 6/2005 | Vreeke et al. | |
| 2005/0171790 A1 | 8/2005 | Blackmon | |
| 2005/0203718 A1* | 9/2005 | Carek | G06F 17/50 703/1 |
| 2005/0251478 A1 | 11/2005 | Yanavi | |
| 2005/0273401 A1 | 12/2005 | Yeh et al. | |
| 2006/0085322 A1 | 4/2006 | Crookshanks | |
| 2006/0185275 A1 | 8/2006 | Yatt | |
| 2006/0253214 A1 | 11/2006 | Gross | |
| 2007/0016437 A1 | 1/2007 | Elmufdi et al. | |
| 2007/0067146 A1 | 3/2007 | Devarajan et al. | |
| 2007/0073593 A1 | 5/2007 | Perry et al. | |

(56) References Cited

U.S. PATENT DOCUMENTS

| | | |
|---|---|---|
| 2007/0112635 A1 | 5/2007 | Loncaric |
| 2007/0198231 A1 | 8/2007 | Walch |
| 2008/0120086 A1 | 5/2008 | Lilley et al. |
| 2008/0183614 A1 | 7/2008 | Gujral et al. |
| 2008/0269942 A1 | 10/2008 | Free |
| 2008/0281678 A1 | 11/2008 | Keuls et al. |
| 2009/0058860 A1 | 3/2009 | Fong et al. |
| 2009/0208773 A1 | 8/2009 | DuPont |
| 2009/0299799 A1 | 12/2009 | Racho et al. |
| 2009/0319388 A1 | 12/2009 | Yuan et al. |
| 2011/0040542 A1 | 2/2011 | Sendhoff et al. |
| 2011/0047140 A1 | 2/2011 | Free |
| 2011/0209081 A1 | 8/2011 | Chen et al. |
| 2011/0213757 A1 | 9/2011 | Bhaskaran et al. |
| 2012/0016678 A1 | 1/2012 | Gruber et al. |
| 2012/0072299 A1 | 3/2012 | Sampsell |
| 2012/0230548 A1 | 9/2012 | Calman et al. |
| 2012/0316667 A1 | 12/2012 | Hartloff |
| 2013/0055126 A1* | 2/2013 | Jackson .............. G06F 3/04845 715/769 |
| 2013/0097259 A1 | 4/2013 | Li |
| 2013/0100128 A1 | 4/2013 | Steedly et al. |
| 2013/0138529 A1 | 5/2013 | Hou |
| 2013/0143512 A1* | 6/2013 | Hernandez .............. H04W 4/00 455/404.1 |
| 2013/0144566 A1 | 6/2013 | De Biswas |
| 2013/0166470 A1 | 6/2013 | Grala et al. |
| 2013/0218961 A1 | 8/2013 | Ho |
| 2013/0293580 A1 | 11/2013 | Spivack |
| 2013/0297320 A1* | 11/2013 | Buser ..................... B33Y 40/00 704/275 |
| 2013/0297460 A1 | 11/2013 | Spivack |
| 2013/0311914 A1* | 11/2013 | Daily ........................ G06F 8/38 715/763 |
| 2013/0325410 A1 | 12/2013 | Jung et al. |
| 2014/0042136 A1 | 2/2014 | Daniel et al. |
| 2014/0067333 A1 | 3/2014 | Rodney et al. |
| 2014/0075342 A1 | 3/2014 | Corlett |
| 2014/0098094 A1 | 4/2014 | Neumann et al. |
| 2014/0157579 A1 | 6/2014 | Chhabra et al. |
| 2014/0207605 A1 | 7/2014 | Allin et al. |
| 2014/0229316 A1 | 8/2014 | Brandon |
| 2014/0279177 A1 | 9/2014 | Stump |
| 2014/0351778 A1* | 11/2014 | Osanai ................ G06F 17/5036 716/113 |
| 2014/0379119 A1 | 12/2014 | Sciacchitano et al. |
| 2015/0055085 A1 | 2/2015 | Fonte et al. |
| 2015/0066189 A1 | 3/2015 | Mulligan et al. |
| 2015/0127480 A1 | 5/2015 | Herrman et al. |
| 2015/0169286 A1* | 6/2015 | Ezra ........................ G06F 3/167 715/728 |
| 2015/0234377 A1 | 8/2015 | Mizikovsky |

FOREIGN PATENT DOCUMENTS

| | | |
|---|---|---|
| WO | 171626 A2 | 9/2001 |
| WO | 2001077781 A2 | 10/2001 |
| WO | 2006086332 A2 | 8/2006 |
| WO | 2007067248 A2 | 6/2007 |
| WO | 2011139630 A1 | 11/2011 |
| WO | 2011140646 | 11/2011 |
| WO | 2013058764 A1 | 4/2013 |
| WO | 2014152396 A2 | 9/2014 |

OTHER PUBLICATIONS

Xue, S & Y Kou, X & Tan, sooi thor. (2009). Natural Voice-Enabled CAD: Modeling via Natural Discourse. Computer-Aided Design & Applications. 6. 125-136. 10.3722/cadaps.2009.125-136.*
Defining Lead Time for APS Planning; http://t3.apptrix.com/syteline/Language/en-US/Other/Process/Defining_Lead_Time.htm [online][retrieved Mar. 31, 2017].
"Quartiles." Mathisfun.com. Web. <https://www.mathsisfun.com/data/quartiles.html>. Archive. <https://web.archive.org/web/20170313183511/https://www.mathsisfun.com/data/quartiles.html> [online] [retrieved Mar. 31, 2017].
Wu et al. Interactive 3D Geometric Modelers with 2D UI, 2002, State University of Campinas, www.dca.fee.unicamp.br, Sao Paulo, Brazil; 2002, 8 pages.
"Upload Your Photos, Print a 3D Model with hypr3D." SolidSmack. http://www.solidsmack.com/cad-design-news/hypr3d-photo-video-3d-print/; last accessed on Oct. 13, 2015.
"123D Catch." Autodesk. http://apps.123dapp.com/catch/ [online] [retrieved Mar. 31, 2017].
Rothganger et al. "3D Object Modeling and Recognition from Photographs and Image Sequences." Toward Category-Level Object Recognition. 2006, pp. 105-126, vol. 4170 of the series Lecture Notes in Computer Science. Springer Berlin Heidelberg.
Dealer Information Systems Corporation. "Parts Inventory." http://dis-corp.com/content/agriculture/inventory/parts-inventory. [online] [retrieved Mar. 31, 2017].
eMachineShop. "Emachineshop Features." http://www.emachineshop.com/machine-shop/Features/page518.html. [online] [retrieved Mar. 31, 2017].
Retrieved from:http://www.solidworks.com/sw/products/3d-cad/manufacturing-cost-estimation- quoting.htm p. 1: Automatic Manufacturing Cost Estimation Overview; Solidworks; 2015.
Retrieved from: http://www.gom.com/fileadmin/user_upload/industries/touch_probe_fixtures_EN.pdf; Application Example: Quality Control, Online Calibration and Validation of Fixtures, Jigs and Gauges. GOM mbH, 2008.
http://citeseerx.ist.psu.edu/viewdoc/download?doi=10.1.1.194.7785&rep=rep1&type=pdf Kim, Jin Baek, and Arie Segev. "A web services-enabled marketplace architecture for negotiation process management." Decision Support Systems 40.1 (2005): 71-87.
Jaiswal, Ashutosh et al., "Design and Implementation of a Secure Multi-Agent Marketplace", Elsevier Science, pp. 1-23, Jun. 3, 2004; http://magnet.cs.umn.edu/papers/Jaiswal04cera.pdf.
http://www.computer.org/csdl/proceedings/hicss/2005/2268/01/22680038.pdf Bui, Tung, and Alexandre Gachet. "Web services for negotiation and bargaining in electronic markets: Design requirements and implementation framework." System Sciences, 2005. HICSS'05. Proceedings of the 38th Annual Hawaii International Conference on. IEEE, 2005.
http://www.bridgelinedigital.com/File%20Library/Repository/eCommerce/Sample-eCommerce-RFP-Template_Bridgeline-Digital.pdf. Sample RFP Template: Ecommerce Platform, Bridgeline Digital, 2014.
Matchbook, Tealbook, http://www.matchbookinc.com/ Sep. 28, 2015.
3Diligent, Source Smarter, http://www.3diligent.com/customer.html; Sep. 28, 2015.
Dassault Systemes, Brochure, Mar. 24, 2010: New Features Type3ToCatia http://www.type3.us/content/download/2202/405535/file/New%20Feature_Type3ToCatia_2010 _US%20old.pdf.
Xue, S., X. Y. Kou, and S. T. Tan. "Natural voice-enabled CAD: modeling via natural discourse." Computer-Aided Design and Applications 6.1 (2009): 125-136.
Sharma, Anirudh, et al. "MozArt: a multimodal interface for conceptual 3D modeling." Proceedings of the 13th international conference on multimodal interfaces. ACM, 2011.
Sorpas ("User Manual,", Swanted Software and Engineering Aps, 2011 (120 pages)).
Kalpakjian, S. and Schmid, S., *Manufacturing Processes for Engineering Materials*, $5^{th}$ Ed. Pearson (Jul. 27, 2007).
Wang and Bourne, *Design and Manufacturing of Sheet Metal Parts: Using Features to Aid Process Planning and Resolve Manufacturability Problems*, Robotics and Computer-Integrated Manufacturing, vol. 13, No. 3, pp. 281-294 (1997).
U.S. Appl. No. 14/267,447, Aug. 5, 2015, Office Action.
U.S. Appl. No. 14/197,922, Nov. 26, 2014, Office Action.
U.S. Appl. No. 14/197,922, Apr. 27, 2015, Response to Office Action.
U.S. Appl. No. 14/197,922, May 15, 2015, Office Action.
U.S. Appl. No. 14/267,447, Jun. 18, 2015, Response to Office Action.

(56) References Cited

OTHER PUBLICATIONS

U.S. Appl. No. 14/263,665, Oct. 8, 2015, Office Action.
U.S. Appl. No. 14/053,222, Jan. 29, 2016, Office Action, now U.S. Pat. No. 9,606,701.
U.S. Appl. No. 14/311,943, Apr. 27, 2016, Office Action.
U.S. Appl. No. 14/486,550, May 26, 2016, Office Action.
U.S. Appl. No. 14/060,033, Jun. 15, 2016, Office Action.
U.S. Appl. No. 14/172,462, Jul. 6, 2016, Office Action.
U.S. Appl. No. 14/053,222, Jul. 29, 2016, Response to Office Action.
U.S. Appl. No. 14/185,204, Jul. 29, 2016, Office Action.
U.S. Appl. No. 14/062,947, Sep. 16, 2016, Office Action.
U.S. Appl. No. 14/457,758, Sep. 30, 2016, Office Action.
U.S. Appl. No. 14/457,758, Mar. 29, 2017, Response to Office Action.
U.S. Appl. No. 14/195,391, Oct. 18, 2017, Office Action.
U.S. Appl. No. 14/172,404, Oct. 20, 2017, Office Action.
U.S. Appl. No. 14/275,116, Dec. 28, 2016, Office Action.
U.S. Appl. No. 14/303,372, Jan. 11, 2017, Office Action.
U.S. Appl. No. 14/246,254, Jan. 11, 2017, Office Action.
U.S. Appl. No. 14/229,008, Jan. 13, 2017, Office Action.
U.S. Appl. No. 14/303,372, filed Jun. 12, 2014.
U.S. Appl. No. 14/185,204, filed Feb. 20, 2014.
U.S. Appl. No. 14/246,254, filed Apr. 7, 2014.
U.S. Appl. No. 15/388,940, filed Dec. 22, 2016.
U.S. Appl. No. 15/728,275, filed Oct. 9, 2017.
U.S. Appl. No. 15/807,153, filed Nov. 8, 2017.
U.S. Appl. No. 15/861,490, filed Jan. 3, 2018.
U.S. Appl. No. 14/486,550, filed Sep. 15, 2014, now U.S. Pat. No. 9,613,020.

* cited by examiner

CAD Context Database 800

| Command Topic | Required Information ||||||| Search Address ||||
|---|---|---|---|---|---|---|---|---|---|---|---|
| | Part Material | Min/Max Thickness | Surface Area | Hole Diameters | Overall Part Dimensions (L x W x H) | Flat Boundary Dimensions | Formula based calc? | McMaster Carr | PEM | Metal Depot | etc... |
| Screw | Yes | Yes | X | Yes | X | X | Yes | X | Yes | X | ... |
| Bolt | Yes | Yes | X | Yes | X | X | Yes | Yes | X | X | ... |
| Nut | Yes | X | X | Yes | X | X | X | Yes | Yes | X | ... |
| Sheet Metal | Yes | Yes | Yes | X | Yes | Yes | X | X | X | Yes | ... |
| Rip | X | Yes | X | X | X | Yes | Yes | X | X | X | ... |
| Bend | Yes | Yes | X | X | X | Yes | Yes | X | X | X | ... |
| Rivet | Yes | Yes | X | Yes | X | X | Yes | X | X | X | ... |
| Seam Weld | Yes | Yes | X | X | X | X | Yes | X | X | X | ... |
| etc... | ... | ... | ... | ... | ... | ... | ... | ... | ... | ... | ... |

FIG. 8

NATURAL LANGUAGE USER INTERFACE FOR COMPUTER-AIDED DESIGN SYSTEMS

RELATED APPLICATION DATA

This application is a continuation-in-part of U.S. patent application Ser. No. 15/388,940, filed on Dec. 22, 2016, which is a continuation of U.S. patent application Ser. No. 14/486,550, filed on Sep. 15, 2014, and entitled "Natural Language User Interfaces For Computer-Aided Design Systems," which is patented with U.S. Pat. No. 9,613,020 B1 issued on Apr. 4, 2017. Each of U.S. patent application Ser. No. 15/388,940, U.S. patent application Ser. No. 14/486,550, and U.S. Pat. No. 9,613,020 B1 is incorporated by reference herein in its entirety. This application is a continuation-in-part of U.S. patent application Ser. No. 14/229,008, filed on Mar. 28, 2014, the entirety of which is incorporated herein by reference.

FIELD OF THE INVENTION

The present invention generally relates to the field of computer-aided design. In particular, the present invention is directed to natural language user interfaces for computer-aided design systems.

BACKGROUND

Computer-aided design (CAD) programs allow designers to create computer models of products to be manufactured. Such programs can be incredibly complex and take extensive training and use before a designer becomes efficient in the use of the program. Natural language interfaces have been proposed as a means for simplifying many different human-machine interactions. While such programs are having increasing success in terms of adoption for general use, for example, the ability to ask simple questions like weather or direction queries of a mobile phone interface (see, e.g., US Pub. No. 2012/0016678, entitled "Intelligent Automated Assistant," which is incorporated by reference herein in its entirety), such systems still do not provide an adequate or user-friendly interface for many complex systems, such as CAD programs, that employ specialized language and wherein context-specific terminology has multiple meanings and/or multiple defining parameters that vary with the context.

While attempts have been made at providing natural language interfaces for CAD systems (see, e.g., US Pub. No. 2009/0058860, entitled "Method For Transforming Language Into A Visual Form," which is incorporated by reference herein in its entirety), such systems in themselves have been overly complex and have not produced results that have led to general application and use. Moreover, such systems do not provide flexibility and portability for use in the increasingly ubiquitous process of collaborative design.

SUMMARY OF THE DISCLOSURE

In an implementation, the present disclosure is directed to a method of providing a natural language interface for a computer-aided design (CAD) system. The method includes automatedly, via a computing device, displaying to the user a model display graphical user interface (GUI). The method includes automatedly, via the computing device, displaying to the user, in the model display GUI, a view window designed and configured to display a first view of the CAD model. The method includes automatedly, via the computing device, displaying to the user, in the model display GUI, a spectrum GUI designed and configured to allow the user to selectively add CAD-tool functionality to the model display GUI. The method includes automatedly, via the computing device, receiving a user voice input comprising a plurality of words and referring to a specific CAD-tool functionality. The method includes automatedly, via the computing device, parsing the user voice input. The method includes automatedly, via the computing device, determining a meaning for the parsed user voice input, the meaning including a reference to the specific CAD-tool functionality. The method includes automatedly, via the computing device, assembling a query for additional information based on the meaning. The method includes automatedly, via the computing device, sending the assembled query to a corresponding information location. The method includes automatedly, via the computing device, receiving queried information from the corresponding information location. The method includes automatedly, via the computing device, translating received information into a response. The method includes automatedly, via the computing device, determining that the response includes a command for the spectrum GUI regarding the specific CAD-tool functionality. The method includes automatedly, via the computing device, sending the command regarding the specific CAD-tool functionality to the spectrum GUI.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 7 is a flow diagram illustrating a sub-step within the embodiments shown in FIG. 5 or 6;

FIG. 8 schematically represents a partial example of information contained within a context database according to an embodiment of the present invention;

FIGS. 10A and 10B are block diagrams schematically illustrating another exemplary embodiment of query generating algorithm, wherein FIG. 10A represents an exemplary parsing algorithm and FIG. 10B represents an exemplary query algorithm;

DETAILED DESCRIPTION

Figure 1A:
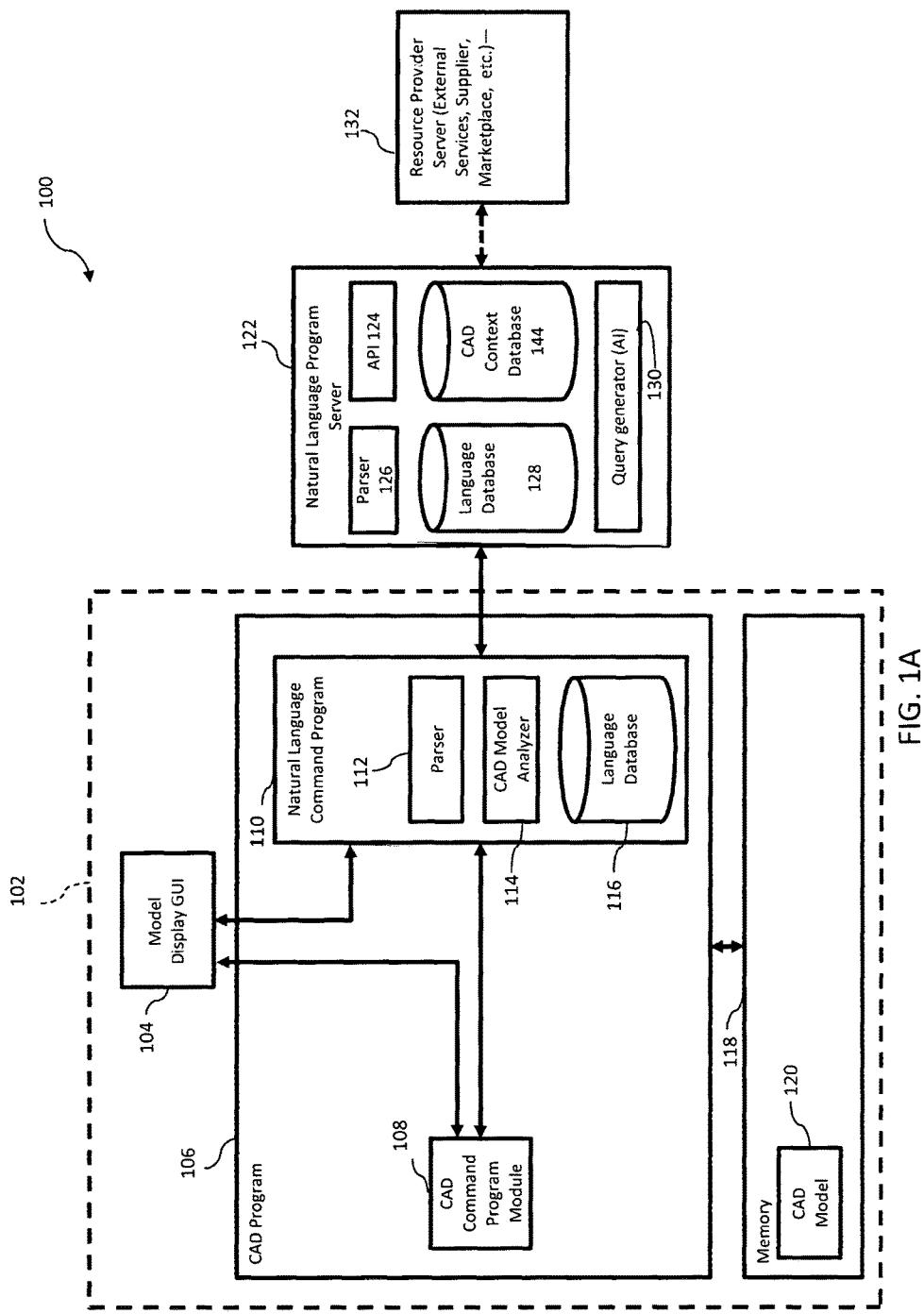
FIG. 1A is a block diagram schematically illustrating a system according to one embodiment of the present invention.

Aspects of the present invention include techniques, methods, hardware and software for providing natural language interfaces in and for a model display and collaborative editing system including a user-modifiable "spectrum" interface. Exemplary embodiments are described herein below and illustrated in the accompanying drawings. It will be understood by those skilled in the art that various changes, omissions and additions may be made to that which is specifically disclosed herein without departing from the spirit and scope of the present invention.

As used herein and in the appended claims, the term "spectrum" is used to denote that a corresponding viewer or other interface has a set of functionalities that a user can modify as desired. For example, the functionalities may correspond to various manipulations of a CAD model of a structure that is the subject of a request for pricing for fabrication, and a user may add to and/or delete from this set the functionalities contained therein as desired. Herein, a structure may be an object or part having a particular geometry, while a computer model may be a virtual representation of a structure and may be created using one or more appropriate CAD programs. Examples of a structure include a piece of sheet metal, a solid cube, a cylindrical pipe, an injection molded plastic toy, apparel such as a shirt made of cotton, and an assembly of various parts such as a vehicle, among others. A project (or design) may refer to a CAD model part or an assembly of CAD model parts that may be a virtual representation of a particular structure and may be created using one or more appropriate CAD programs.

In some embodiments, software made in accordance with the present invention displays a model display graphical user interface (GUI), which displays at least a portion of a CAD model to a user. In an exemplary embodiment, the model display GUI includes a spectrum viewer designed and configured to allow the user to selectively augment a model display GUI with additional CAD-model functionality. One or more aspects of the present invention can be implemented in any of a wide variety of manners, such as within a single computing device or by two or more networked computing devices, among others. In some embodiments, functionalities of the system may be integrated into computer modeling programs directly via add-on software.

As would be apparent to one reasonably skilled in the art, aspects and embodiments of the invention may be applied to any number of manufacturing types, including but not limited to the manufacture of apparel and sheet metal products among others. In the case of sheet metal and apparel, designers use CAD systems to design their products, using sheets of flat material for manufacture. Design data, such as material choice, precise dimensions, or locations of additional features may be embedded within the digital design. Designers may choose different metals or fabrics (including non-woven materials such as leather) depending on the strength and other inherent properties of the material, which affects what manufacturing methods may be necessary to work the material. Purchased components (in some cases, identical purchased components) may be added to the design. CAD programs may be used to visualize the shape of the finished product. In both sheet metal and apparel manufacturing the sheet (metal or fabric) may be cut or stamped by a variety of methods using computerized machines. Units are moved from station to station during manufacture. Where sheet metal is connected by rivets or welding, sheet fabric is connected by stitching or gluing. Surface finishes may be applied to both; both may be painted, silk-screened, or otherwise covered with a protective substance. While sheet metal and fabric apparel products have commonalities as discussed above, it will be appreciated by those skilled in the art that other design and manufacturing types which may or may not share many of the same attributes are also amenable to application of embodiments of the present invention.

Referring first to FIG. 1A, an exemplary embodiment of a system 100 in accordance with the teaching of the present invention is described. In one implementation, system 100 includes one or more computing devices with appropriately networked and/or communicating modules. For example, sub-system 102 may include a computer, other computing device or other system as may be devised by a person of ordinary skill for executing functionalities as described herein based on appropriately coded instructions. Model display GUI may include a view window, spectrum GUI, and other modules and/or functionalities as described in further detail below. Model display GUI 104 may interface with I/O devices, which may include language-based I/O devices such as a microphone and speakers, as well as other I/O devices such as mouse, keyboard, touch pad or touch screen. CAD program 106 and memory 118 are also included in sub-system 102. CAD program 106 includes, in addition to conventional CAD system functionality, natural language command program 110. Natural language command program 110 includes parser 112, CAD model analyzer 114 and language database 116. CAD model 120 typically resides in a memory device, such as memory 118 although the memory need not be configured as a part of the system per se, but may be functionally remote and communicate with the system through an appropriate network.

CAD model analyzer 114 functions as a form of interrogator that interrogates the CAD model to return CAD model data as called for by various program functions. In some embodiments, other system modules may include and/or maintain such an interrogator for interrogating information from a CAD model. Additionally or alternatively, natural language program sever module 122, and/or resource provider server module 132 may contain such an interrogator, for example, as a portion of or add-on to a CAD program. CAD model analyzer 114 may analyze a CAD model and output data that may be received and used by natural language command program module 110 or other system modules. Illustrative embodiments for such an analyzer/interrogator may be found in U.S. patent application Ser. No. 14/060,033, filed on Oct. 22, 2013, and titled "AUTOMATED FABRICATION PRICE QUOTING AND FABRICATION ORDERING FOR COMPUTER-MODELED STRUCTURES", which is incorporated by reference herein for its teachings of extracting data from computer models, and U.S. patent application Ser. No. 14/282,773, filed on May 20, 2014, and titled "METHODS AND SOFTWARE FOR ENABLING CUSTOM PRICING IN AN ELECTRONIC COMMERCE SYSTEM", which is incorporated by reference herein for its teachings of particular interrogator engines, U.S. patent application Ser. No. 15/467,079, filed on Mar. 23, 2017, and entitled "ELECTRONIC PRICING MACHINE CONFIGURED TO GENERATE PRICES BASED ON SUPPLIER WILLINGNESS AND A USER INTERFACE THEREFOR," which is incorporated by reference herein for its teachings of particular interrogation engines, extraction of information from interrogation engines, analysis of geometry in design files by interrogation engines, extraction of pricing data from computer models, and for generation of pricing for manufactured materials, U.S. Patent Application Ser. No. 62/072,653, filed on Oct. 30, 2014, and titled "METHODS AND SOFTWARE FOR FACILITATING PRICING AND ORDERING OF A STRUCTURE REPRESENTED IN A COMPUTER MODEL," which is incorporated by reference herein for its teachings of various interrogation engines and related functionality and for generation of pricing for manufactured materials.

CAD program module 106 may include any of the modules in a conventional CAD system or program that govern one or more functions of the CAD program 106 as would be understood by persons of ordinary skill in the art. Examples of other CAD system models, not shown, may include: create new item module, select material module, bend module, weld module or cut module. However, natural language command program module 110 is in addition to the conventional modules of the CAD system or program.

Parser 112 parses content of spoken commands received through Model display GUI 104 and communicates with language database 116 to determine relevant portions of the spoken command for formulating a query as discussed in more detail below. CAD model analyzer 114, like interrogator, searches for specific information in CAD model 120 and communicates with natural language server module 122.

Figure 5:
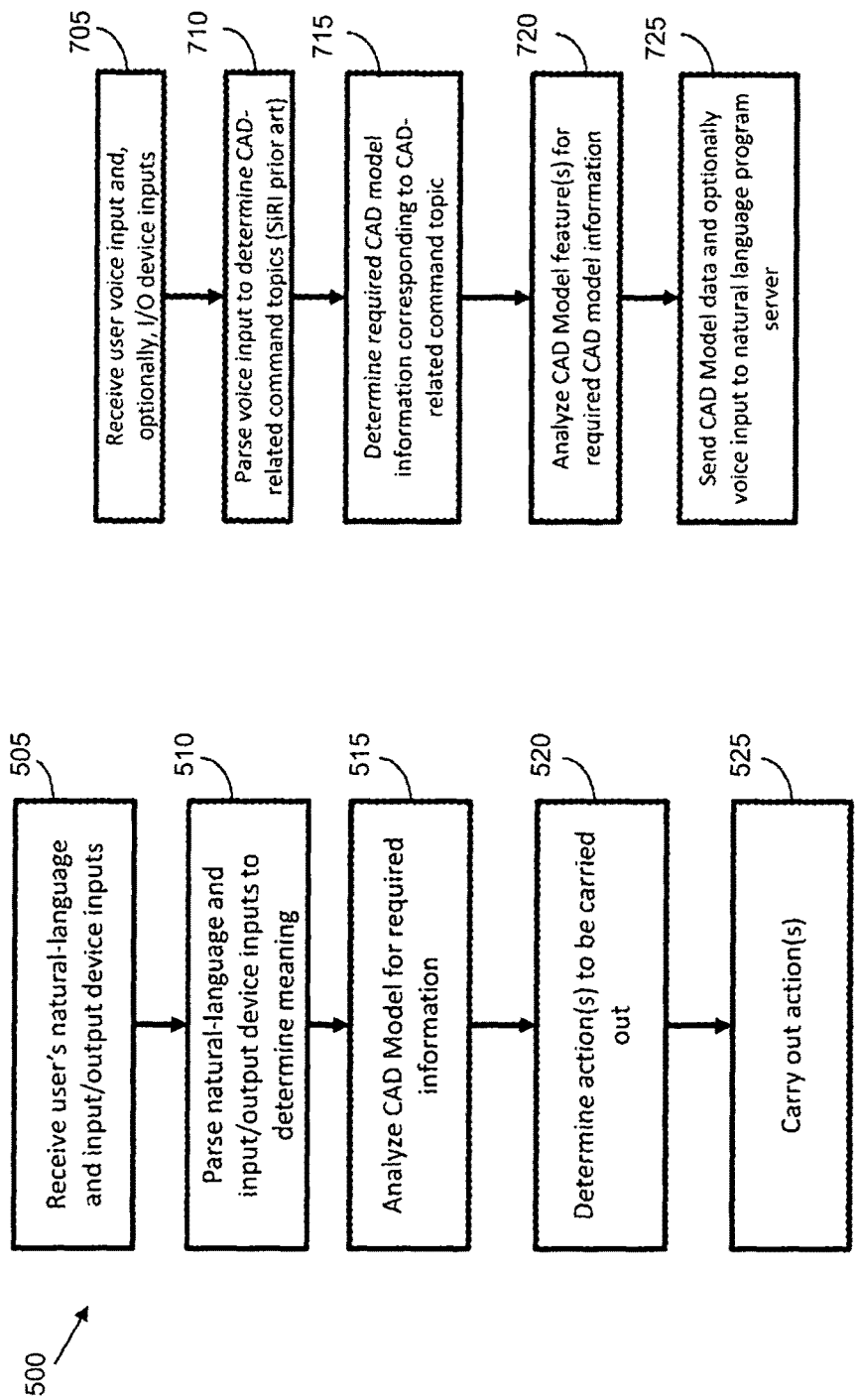
FIG. 5 is a flow diagram illustrating a high-level method according to an embodiment of the present invention.

Natural language program server module, which may be remotely located, may include a high capacity server/database to assist in parsing any natural language commands that cannot be parsed through resident module 110. Thus, natural language program server module 122 includes parser 126, which is similar in function to parser 112 but more powerful, and API 124, which would be used to translate commands into required syntax for other system modules, for example, to communicate with resource provider server module 132. Language database 128 is a larger, more powerful version of database 116, and may include multiple specialized, plurally accessible library-type databases. Query generator 130 may include the artificial intelligence for query generation as described herein below (see, for example, FIGS. 6, 7A and 7B) and thus may include a processor and memory of its own, as well as other associated hardware and software suited for its query generation function. CAD context database 144 contains CAD specific information as shown in FIG. 5 and described in more detail below.

Resource provider server module 132 provides external services and/or information when called for by module 122. For example, when information needed to respond to a query resides outside of the CAD system and natural language program server module 122, automated searching of appropriate databases is initiated, the databases being supplied as resource provider server modules 132 in order to provide information from suppliers, marketplaces, and other external services. In some examples, resource provider server module 132 is an external service supplier marketplace database, either a source of information or standalone entity that will perform calculations. Resource provider server module 132 and/or natural language program server 122 may further contain or provide information identifying CAD-tool functionality; information identifying CAD-tool functionality may include information identifying CAD tools as further defined below. Information identifying CAD tools may include information identifying viewing tools. Information identifying CAD tools may include information identifying CAD manipulation tools. Information identifying CAD-tool functionality may include information identifying marketplace tools as further defined below. As a non-limiting example, information identifying a CAD-tool functionality may include one or more relationships of particular words or phrases to the CAD-tool functionality; relationships may be identified or implemented according to any method of correlation, natural language processing, or referential storage, including without limitation vector similarity methods, links between tables or data structures such as relational databases, and the like. Information identifying CAD-tool functionality may include relationships between CAD-tool functionality and particular commands, such as commands to activate the CAD-tool functionality and commands that implement the CAD-tool functionality, including without limitation commands to perform particular actions in a CAD system.

Figure 1B:
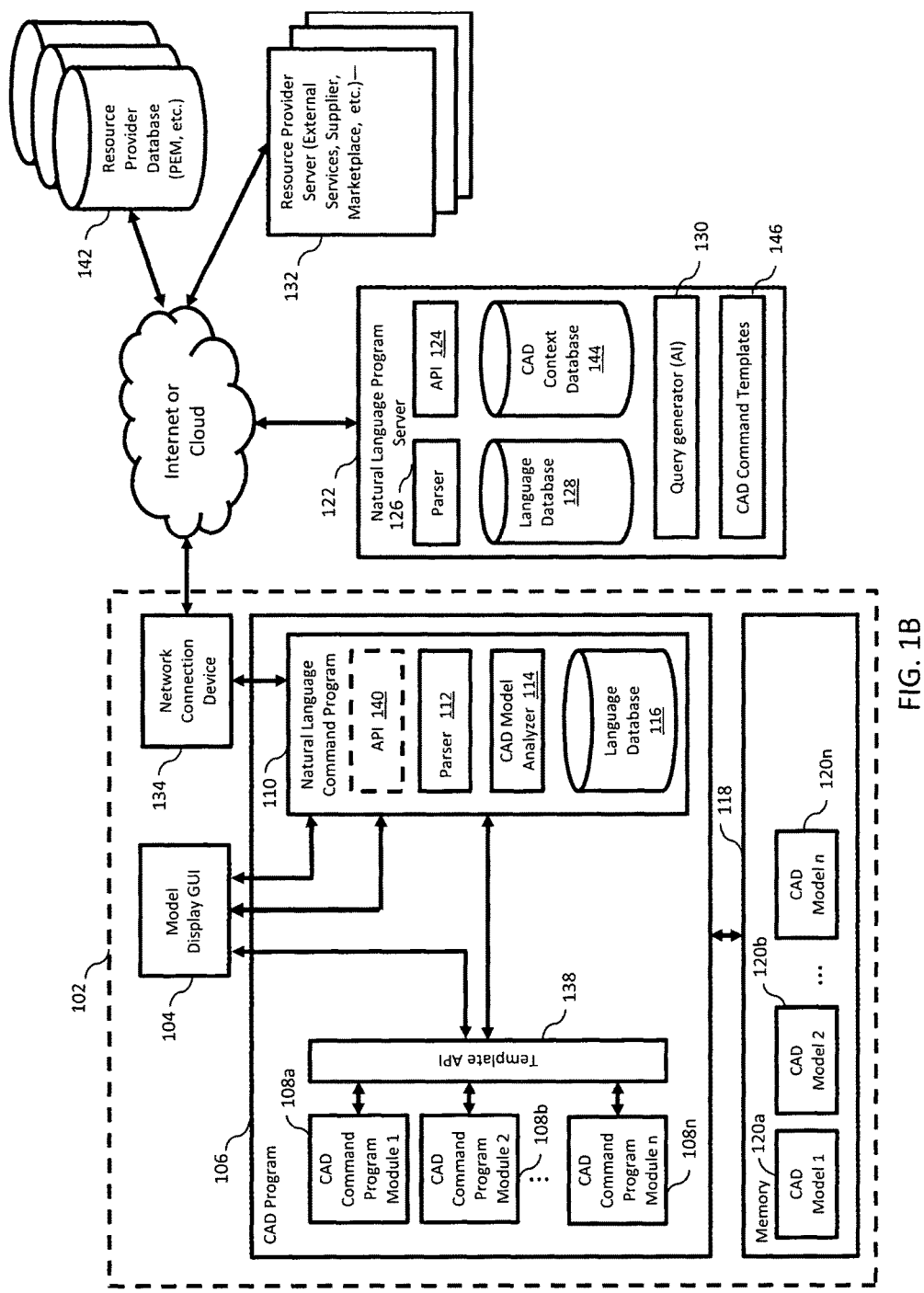
FIG. 1B is a block diagram schematically illustrating an alternative system according to another embodiment of the present invention.

With reference to FIG. 1B, a further alternative system is described. As will be seen, the basic components of FIG. 1A are carried over to the embodiment of FIG. 1B. Added components include network connection device 134 that permits communication with a network, the Internet or information stored in a cloud. Communication through this path may be with natural language program server module 122 as previously described, as well as multiple resource provider server modules 132 and direction with resource provider databases 142.

In this embodiment, CAD program 106 also includes plural CAD program modules 108a, b . . . n communicating with natural language command program module 110 through template API 138. Template API 138 is used to translate commands and other information coming back from the natural language command program module 110 into a command that can be used by the particular CAD program. Model display GUI 104 communicates between Model display GUI 104 and natural language command program module 110 to facilitate interaction with the user. Optional API 140 inside natural language command program module 110 translates and facilitates communications between the various sub-modules.

Within natural language program server module 122, CAD command templates 146 are used in conjunction with template API 138 to send instructions in the language that the CAD program 106 will understand. Thus, CAD model 120a, b, . . . n is to be changed using a command program module. Template API 138 translates a command in a template form to a command that is actually understood by the module.

In operation, a natural language command plus any additional information concomitantly entered is received through Model display GUI 104 and directed to natural language command program module 110, which then parses the command, breaking it into pieces and identifying, using language database 116, the meaning of the command. Information that is identified as being contained within CAD model 120 is analyzed and retrieved by CAD model analyzer 114 by interrogating the CAD model. If for some reason natural language command program module 110 is unable to determine the meaning of a command, it will send an audio file to natural language program server module 122 to be further parsed by parser 126, accessing language database(s) 128. Also at this point, CAD context database 144 communicates with parser 126 to determine what information must be pulled from CAD model 120. Pulled information is sent back through CAD model analyzer 114 to server module 122 and query generator 130 generates a query based on retrieved information.

CAD context database 144 supplements language databases 116 and 128 with CAD specific contextual information that is accessed, for example, when parser 126 is unable to parse a command by access to the more general language databases or if more than one contextual meaning is identified. For example, CAD context database 144 contains information necessary to identify a bolt as a purchase part that is associated with a nut, to separate it from other general language context meanings (i.e., to leave quickly or a lightning bolt). CAD context database 144 also contains information to direct natural language server program module 122 to query resource provider modules 132 when supplier-type or other externally provided information is needed for query completion.

If the query can be executed by the CAD program 106 without further information or data inputs, then the command is translated to the CAD program 106 through natural language command program module 110. However, when the query requires additional, non-resident information, the query is then translated by API 124 and sent to resource provider server module 132 for answer. When the response is returned from resource provider server module 132, API 124 translates the response into a format that can be used by the CAD program 106 module and it is sent back through natural language command program module 110, which delivers an output, such as an auditory output, through Model display GUI 104 and/or instructs the CAD command program module 108 to execute the command.

The following prophetic examples further illustrate operation of embodiments of the system thus far described to modify CAD models. As is typical in natural language interfaces, the "system" is assigned a name to be spoken by the user to initiation language recognition and parsing, and to distinguish commands from other spoken words. Any suitable name may be assigned. In this case, for illustration purposes only, the assigned name is "Nalcop," representing natural language command program module 110.

Example 1

In operation, a user clicks a hole and says, "Nalcop, I need bolts to fit this hole." Nalcop parses the command with parser 112 and determines that "this hole" refers to a highlighted feature in the displayed CAD model. Natural language command program module 110 then uses CAD model analyzer 114 to gather all data related to the hole from CAD model 120. Then, it sends the data plus message to natural language command program server module 122, where the natural language statement and CAD model data is further parsed (if necessary). Query generator 130 creates a search command using the parsed statement and the CAD model data, and searches resource provider server modules 132 or databases 142 for bolts of the correct diameter and correct length that are compatible with the material in which the hole is located. That data is returned to natural language command program module 110, which displays it in GUI 136.

Example 2

In operation, a user says, "Nalcop, this shelf needs to hold 40 pounds." Natural language command program module 110 cannot initially parse this command, so it sends a voice record to natural language program server module 122. Server module 122 parses the statement and determines that the user's statement is a request to calculate whether the structure can hold 40 pounds. Based on this determination, made using parser 126, language database 128 and CAD context database 144, server module 122 sends natural language command program module 110 instructions to analyze the entire CAD model (to get material, thickness, and angles) and to ask the user which way is up (e.g. necessary to know directionality to perform the analysis) and what factor of safety the user would like to use (e.g., necessary to know how sure the user wants to be that the shelf will hold 40 pounds). Natural language command program module 110 thus poses the required questions through a GUI such as model display GUI 104 and waits for a response from the user. Required CAD model data is accessed by CAD model analyzer 114, combined with user inputs in response to stated questions and transmitted to server module 122. API 124 puts the information in the correct format and sends the data to a resource provider server module 132 which can perform a stress (statics) analysis on a model of that shape using that material. If the analysis determines that the aluminum brackets supporting the shelf will not support the weight, server module 122 sends a "no" answer to natural language command program module 110, which communicates the answer to the user through a GUI such as model display GUI 104. Such communication may take the form of a statement delivered through system speakers. The user may choose to respond to the "no" answer with a further question, such as "Well Nalcop, what will work?" In such a case, that question is parsed to be a request for design modifications. Server module 122 sends common fabrication material options to resource provider server modules 132 to determine whether using a different material in the bracket will work. For purposes of this example, assume stainless steel would be sufficient to hold the weight. In this case, server module 122 may also send different bracket thicknesses, but using the original material (aluminum), to resource provider server modules 132. Assume it is determined that doubling the thickness in the original material will also work. Server module 122 then sends natural language command program module 110 information that the CAD model as it exists will not hold 40 pounds, but stainless steel or double-thickness aluminum will. Natural language command program module 110 then prompts the user through Model display GUI 104 or other GUI to indicate whether he wants to use stainless steel or double the thickness of aluminum. The user selection is sent back to server module 122, which fills out a CAD Command Template 146, which is sent back through natural language command program module 110 to template API 138, which instructs CAD program module(s) 108a, b . . . n to make the change.

Figure 2:
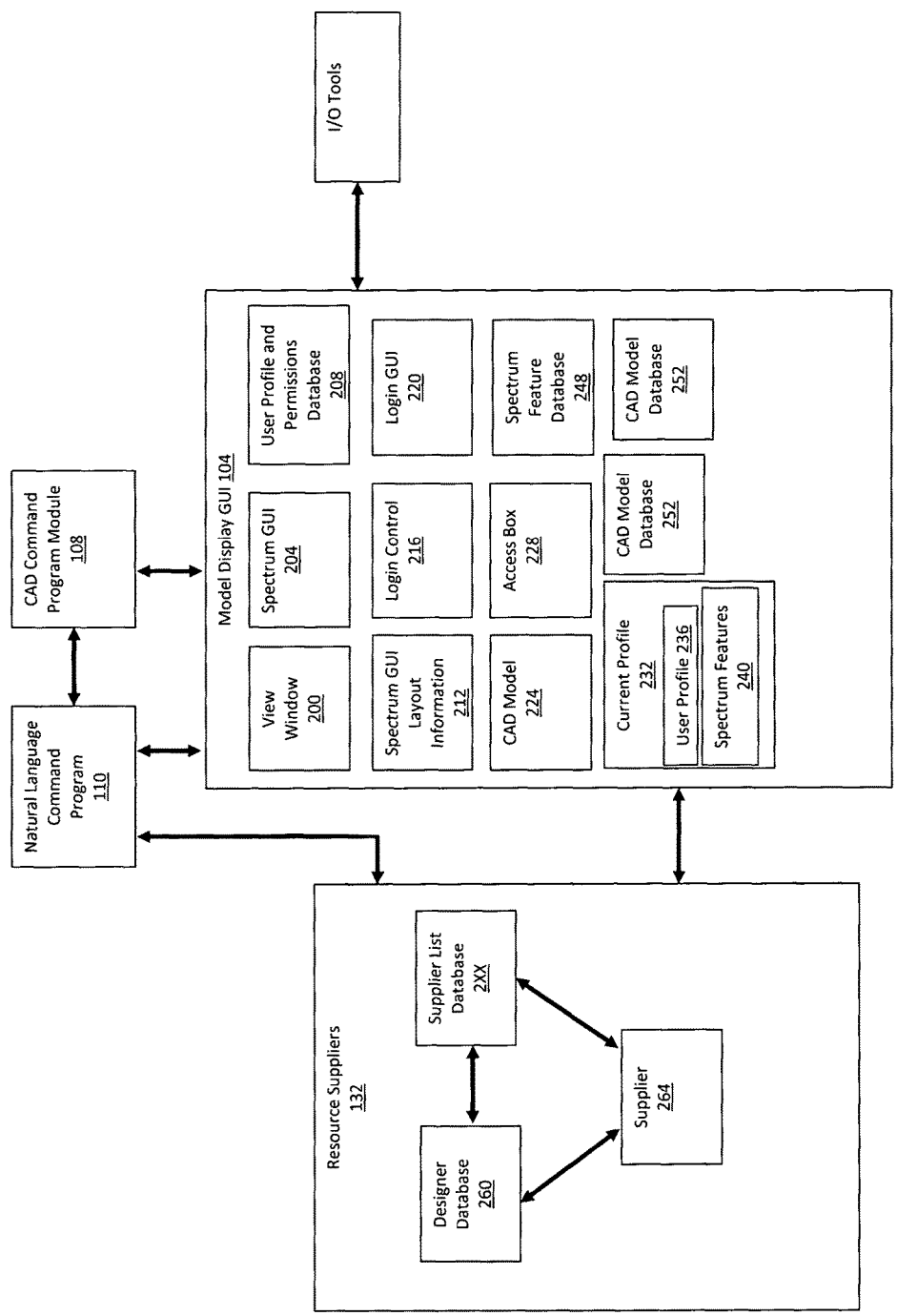
FIG. 2 is a block diagram schematically illustrating a model display GUI according to an embodiment of the present invention.

Referring now to FIG. 2, an exemplary embodiment of Model display GUI 104 is illustrated. Model display GUI 104 may function to interface with a user of system 100. User may be a designer, who may be a person or entity that is designing a CAD model of a structure for manufacture; designer may be an entity or person who is purchasing the structure, one or more components to incorporate in the structure, or one or more manufacturing processes to be performed on the structure. Designer may create or modify CAD model to create manufacturing control instructions for one or more manufacturing devices, including without limitation machine control constructions to machine one or more components or features of structure; designer may create or modify CAD model to provide instructions to one or more suppliers to provide components or perform manufacturing processes on structure. User may be a supplier, who may be an entity or person providing one or more components to be included in or on structure; supplier may be an entity or person providing one or more manufacture services. Supplier may modify or create CAD model to represent one or more components to be added to structure, or to demonstrate one or more modifications to be performed on structure, for example by the supplier. Model display GUI 104 may operate on a computing device or set of computing devices on which natural language program 110 operates. Model display GUI 104 may operate on a dedicated server in communication with natural language command program 110. Model display GUI 104 may communicate with a browser or other remote application operated by suppliers, designers, or other users; persons skilled in the art, upon reviewing the entirety of this disclosure, will be aware of various ways in which a GUI such as model display GUI 104 may be implemented with various combinations of server-side and client-side programs and/or modules.

Model display GUI 104 may include a view window 200. View window 200 may be designed and configured to display at least a portion of CAD model 120. As a non-limiting example, view window 200 may display a particular two-dimensional view of CAD model 120; in other words, where CAD model is a three-dimensional model that, in another modeling program such as a CAD modeling program as described above, may be viewed using any number of two-dimensional projections such as flat views of sides, isometric views, or perspective views, view window 200 may, at least initially, present only one of such views. In an embodiment, presentation of a single view of CAD model 120 in view window may enable more efficient viewing across a network, as only the data necessary for that particular view need be transmitted to the client device accessing model display GUI 104. As noted below, one or more CAD tools may be accessible to user via model display GUI 104, which may allow the user to view multiple views. Depending which cad tools are available, view window 200 may initially display more than one view; for instance, view window 200 may permit a user to move between two or more views, each of which is available in view window 200, according to various CAD-tool functionalities. View window 200 may also provide two or more views simultaneously, for instance using a split or tiled screen. Additional exemplary illustrations of uses for view window 200 are described in the remainder of this disclosure.

Model display GUI 104 may further include a Spectrum GUI 204, which users may access independently or through one or more other programs to view CAD models such as CAD model 120, interact with the marketplace, and/or utilize one or more CAD tools and/or other functionality typically associated with fully featured CAD programs, as described further below. Spectrum GUI 204 may include and/or be accessed through a client that may, by default, lack one or more capabilities of typical CAD programs, such as the ability to design or modify computer models. In some alternative embodiments, Spectrum GUI 204 may be located outside of model display GUI 104, a separate program or application, and/or accessed by means other than model display GUI 104, while still allowing spectrum viewer to access model display GUI 104.

Spectrum GUI 204 may include software a user may utilize to interact with the model display GUI 202, such as, for example, a display presenting any CAD tools and/or spectrum features the user is entitled to access as specified in settings stored in a User profile and permissions database 208. User profile and permissions database 208, may include a database or group of databases and may store user profiles for any users permitted to access Spectrum GUI 204 along with permission information identifying the particular tools/functionality each user is entitled to access. CAD tools may include any tools the Spectrum GUI 204 may add or remove for viewing or manipulating CAD model 120. CAD tools may include viewing tools, which may be tools that enable the user to modify the at least a portion of CAD model 120 shown in view window 200. As a non-limiting example, a viewing tool may enable a user to view the opposite side of CAD model 120 from the side being displayed. A viewing tool may enable a user to rotate CAD model 120 about an axis, which may include any axis defined with respect to a coordinate system in two or three dimensions for CAD model 120. A viewing tool may enable a user to modify a category of view of CAD model 120, including without limitation changing the view to a perspective view, an isometric view, or a straight view of one side or surface represented in CAD model 120. A viewing tool may enable a user to zoom in or out on CAD model 120. CAD tools may include CAD manipulation tools, which may be tools enabling a user to modify one or more features or geometric elements of CAD model 120.

Spectrum GUI 204 may further include spectrum GUI layout information 212, which may indicate an order and/or screen location in which the spectrum viewer may display marketplace tools, viewer tools, and spectrum features in order to provide a consistent and customizable user experience for each individual user. Viewer tools and CAD manipulation tools may be referred to collectively herein as "CAD tools." CAD tools and marketplace tools may be referred to collectively herein as "CAD-tool functionality." The terms "spectrum features" and "CAD tools" are used herein interchangeably, whether in their plural or singular forms. Spectrum GUI 204 may additionally include a login control 216, which may include a software program or module that activates when a user attempts to access the spectrum viewer and requires the user to provide identifying information, such as a username and password, before the user can access the spectrum viewer. Login control 216 may further include a login GUI 220, which may include a graphical user interface that a user may utilize during a login procedure such as providing a username and password. In some embodiments, login GUI 220 may prevent a user from accessing Spectrum GUI 204 and associated components/features without first verifying their identity. Login control 216 may track and utilize login information by any suitable additional means, including cookies storing login information.

Spectrum GUI 204 may additionally include a CAD model 224, which may include a copy of CAD model 120 that a user may alter or manipulate through Spectrum GUI 204. Spectrum GUI 204 may further include an access box 228, which may include a programming module that enables and/or governs a user's ability to gain access to additional marketplace tools, viewer tools, and/or spectrum features. Access box 228 may provide an appropriate GUI and grant users access to such tools/features as a function of one or more of a variety of conditions, such as monetary payments and/or an amount of time a user has spent logged into and/or using model display GUI 104 and/or spectrum GUI 204, among others. Model display GUI 104 and/or spectrum viewer may track an amount of business the user transacts on a marketplace as described in further detail below and change the availability and/or cost of selectively adding CAD-tool and/or other functionality as a function of the amount of business the user transacts. In some embodiments, model display GUI 104 and/or spectrum GUI 204 may display a monetary amount the user may be charged for selectively adding CAD-tool and/or other functionality Spectrum GUI 204 may further include a current profile 232, which may include a programming module and/or data storage that governs and/or indicates a user's ability to access marketplace tools, viewer tools, and/or spectrum features. It is noted that although current profile 232 is shown as part of spectrum GUI 204, in some embodiments it may be stored/located outside of the spectrum viewer and/or model display GUI 104, as appropriate. Current profile 232 may include a user profile 236, which may store data associated with an individual user who is currently accessing model display GUI 104 and/or particular tools the user is authorized to access. Current profile 232 may further include marketplace tools and/or CAD tools, which may provide local/remote copies of any or all marketplace tools, and/or CAD tools a user who is currently accessing model display GUI 104 is authorized to access. Although marketplace tools and/or CAD tools are illustrated as being parts of current profile 232, they may be stored outside of the current profile, spectrum GUI 204, and/or model display GUI 104, as appropriate. In one example, the tools, such as spectrum tools 240 may be temporarily or permanently stored on a user's computer.

Model display GUI 104 may further include a CAD tool database 248, which may include a database or group of databases and may store and/or index CAD tools/CAD tool functionality. A user may utilize spectrum viewer 206 to retrieve and/or utilize such CAD tools from CAD tool database 248 provided that they have appropriate permissions associated with their user profile. As noted above, CAD tools may include functionality typically associated with fully featured CAD programs that a user may utilize to, e.g., directly manipulate, view, and/or alter a CAD model, such as tools to change the size of a structure and/or to change a material type. CAD tool database 248 may include databases, database tables, or other features including CAD manipulation tools, viewer tools, and the like; these may be separate databases which may be linked together.

Model display GUI 104 may further include a CAD model database 252, which may include a database or group of databases containing one or more computer models that a user may have designed within CAD program 106 and/or that the user may import into Model display GUI 104.

Model display GUI 104 may additionally include a marketplace tools database 256, which may include a database or group of databases and may store marketplace tools in the form of, e.g., source code or executable files. A user may utilize spectrum GUI 204 to retrieve and/or utilize such marketplace tools from marketplace tools database 256 provided that they have appropriate permissions associated with their user profile. Marketplace tools may include, e.g., tools that allow a user to interface with model display GUI 104 and/or control operation of a marketplace, such as tools to place orders or sort and filter suppliers.

Spectrum GUI 104 may communicate with a designer database 260. Designer database 260 may be included in system 100, or may communicate with system 100 over a network such as the Internet; for instance, designer database 260 may run on a remote device belonging to a designer. Designer database 260 may store information associated with a design, such as a design generated in a CAD program 106, and may include, for example a server, a hard drive, a CD, a flash drive, and/or cloud storage, among other known data storage devices/services. In some embodiments, designer database 260 may include two or more databases and may include design and/or designer information such as design fabrication specifications and/or documents, CAD files, design images, materials, quantities, need dates, and/or shipping addresses, among others.

Spectrum GUI may communicate with at least a supplier 264. Supplier 264 may be one or more entities that place prices on and/or fabricate one or more parts or projects posted by one or more designers and may be, for example, a manufacturer of sheet metal parts. System 100 may further include a supplier program similar or equivalent to CAD program 106 for allowing a supplier to generate pricing data to be sent to a marketplace and for receiving various data, such as request for pricing and designer information, from the marketplace and/or accepting/reviewing requests for pricing, among other things. Similarly to a designer program, such a supplier program may include, for example, a plurality of programs/websites and/or a single program or website, which may be accessible by one or more supplier 264, among other implementations that will become readily apparent to one of ordinary skill after reading this disclosure in its entirety. In some embodiments, one or more supplier and/or supplier programs may communicate directly with model display GUI 104. Alternatively, model display GUI 104 may contain such supplier programs and/or necessary supplier data for generating CAD model data, component data, and/or pricing request data without the need to regularly access supplier 264 for each request for pricing.

Spectrum GUI may also communicate with a supplier list database 270 for storing information associated with prices from one or more suppliers, such as one or more prices placed by one or more suppliers, a current winning or lowest price, and/or supplier information such as supplier location, capabilities, etc. As with designer database 260, supplier list database 270 may include, for example, a server, a hard drive, a CD, a flash drive, and/or cloud storage, among other known data storage devices/services. In some embodiments, supplier input database 124 may include two or more databases.

It should be noted that in an alternative embodiment, one or more of CAD model database 252, user profile and permissions database 208, marketplace tools database 256, and CAD tool database 248 may be located outside of and/or operate independently from system 100 but may still access system 100.

In operation, a user, such as a supplier 244 or a purchasing agent, may access model display GUI 104 via, for example, a marketplace client, a CAD program, a supplier program, a website, and/or an add-on program in order to access model display GUI 104, which the user may manipulate to activate or display spectrum GUI 204, though it is noted that in some embodiments model display GUI 104 may display spectrum GUI 204 by default without requiring any action from the user. When a user attempts to access spectrum GUI 204, login control 216 may activate login GUI 220, into which the user may enter identifying information, such as a username and password. Login control 216 may verify the identifying information by accessing a profile associated with the user in user profile and permissions database 208. If a user has permission to access spectrum GUI 204, the spectrum viewer may access the information contained in the user's profile in user profile and permissions database 208, store the information to user profile 236 in current profile 232, and provide any tools and features to which they have access by loading them from marketplace tools database 256 and CAD tool database 248 to marketplace tools and spectrum features 240, respectively. Then spectrum GUI 204 may display buttons corresponding to each tool or feature arranged according to the data in spectrum GUI layout information 212. The user may then access a model stored in CAD model database 252, which spectrum GUI 204 may then store in CAD model 224. Once the user loads a CAD model, the user may activate any tool or feature to which they have access, and, depending on the tools or features they have access to, they may manipulate, view, or alter CAD model 224. The user may access other features of model display GUI 104, such as uploading designs and requests for pricing, prices, etc., through spectrum GUI 204 and/or model display GUI 104. After the user finishes working with a loaded CAD model, spectrum GUI 204 or model display GUI 104 may store CAD model 224, including any modifications or updates the user made, in CAD model database 252. At any point, the user may optionally utilize access box 228 to purchase or otherwise obtain access to additional tools or features. The user may select CAD tools and/or enter instructions to modify CAD model 224 using a natural language interface as described in further detail below.

System 100 may further provide a number of data links to enable data communication between various portions thereof. The system may implement these links in the form of, for example, an Internet connection, a local network connection, and/or any other connection between electronic devices or portions of one or more devices. For example, system 100 may provide a design specifications data link between CAD program 106 and designer database 260 that may transmit the contents of designs, design specifications, and/or designer information from the CAD program 106 to storage within designer database 260. System 100 may also provide a design input data link between designer database 260 and model display GUI 104 that may allow CAD model 224 or a portion thereof for display in view window 200 to be provided to model display GUI, and may allow modified CAD model 224 to be provided from model display GUI to designer database 260; data link may also allow new prices and project details to be stored within designer database 260, as well as allowing the most recent prices to be loaded into model display GUI 104 from designer database 260 upon the accessing of Model display GUI 104 by a designer or supplier. System 100 may further provide a supplier upload data link between supplier 264 and supplier list database 270 that may transmit data including without limitation CAD model information, component information, prices from the supplier and/or a supplier program to storage within supplier list database 220. System 100 may additionally provide a supplier pricing data link between supplier list database 270 and model display GUI 104 that may allow new prices and project details to be stored within supplier list database 270, as well as allowing the most recent prices to be loaded into model display GUI 104 from supplier list database 270 upon the accessing of model display GUI 104 by a designer or supplier. System 100 may also include a design output data link between model display GUI 104 and CAD program 106 that may transmit various pricing and supplier information from model display GUI 104 to the CAD program 106. System 100 may further include a supplier output data link between model display GUI 104 and supplier 264 that may transmit various pricing and designer information from model display GUI 104 to a supplier or supplier program.

Figure 3:
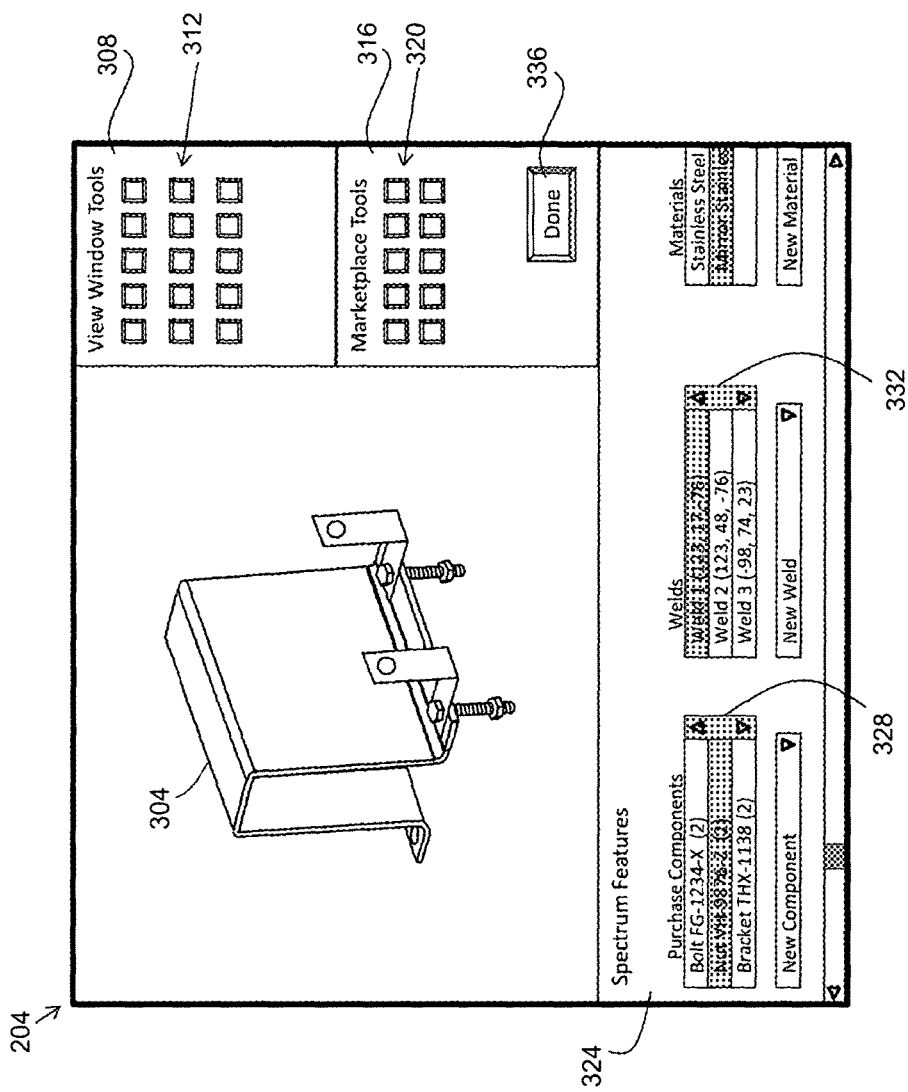
FIG. 3 is a representative screenshot depicting various aspects of an exemplary user interface implemented in accordance with aspects of the invention.

FIG. 3 illustrates a screenshot depicting exemplary aspects of spectrum GUI 204. For example, spectrum GUI 204 may include a structure 304, which may provide a representation of CAD model 224. Spectrum GUI 204 may further include a viewer tools window 308, which may display indicators (e.g., icons or buttons) of viewer tools a user has access to such that the user may select the indicators to activate one or more of the tools. In this example, spectrum GUI 204 provides viewer tools buttons (i.e., CAD-tool selectors) 312 in the form of soft selection buttons that a user may select to activate one or more viewer tools. Spectrum GUI 204 may implement viewer tools buttons 312 in the form of soft-selection buttons or any other appropriate user interface elements; in some embodiments, a user may interact with model display GUI 104 and/or spectrum GUI 204 using voice commands.

Spectrum GUI 204 may also include a marketplace tools window 316, which may display indicators of marketplace tools a user has access to such that the user may select the indicators to activate one or more of the tools in order to interact with model display GUI 104. In this example, spectrum GUI 204 provides marketplace tools buttons 320, such as, for example, a request for pricing selector and/or a place-order selector, in the form of soft selection buttons that a user may select to activate one or more marketplace tools. As with viewer tools buttons 312, spectrum GUI 204 may implement marketplace tools buttons 320 in the form of soft-selection buttons or any other appropriate user interface elements.

Spectrum GUI 204 may additionally include a spectrum feature window 324 to display any spectrum features to which the current user profile has access such that a user may modify CAD model 224. First spectrum feature 328 of spectrum feature window 324 may include a drop-down menu, which a user may alter or manipulate in order to alter or manipulate one or more portions of CAD model 224. For example, first spectrum feature 328 may provide a user with a menu that the user can manipulate to change, add, or delete one or more purchased components that are part of or associated with CAD model 224 or to access a third party purchased parts catalogs such as the PEM (Penn Engineering & Manufacturing Corp.) catalog, which may be accessed through the Internet and/or represented electronically. Purchase part catalogs may contain third party manufactured parts such as fasteners and other standard components. Second spectrum feature 332 of spectrum feature window 324 may include a dropdown menu similar to first spectrum feature 328. For example, second spectrum feature 332 may provide a user with a menu that the user can manipulate to change one or more welds that are part of or associated with CAD model 224. Spectrum GUI 204 may also include a "done" button 336 that a user may select to indicate that they have finished working with spectrum viewer 206. It is noted that although "done" button 336 is shown within marketplace tools window 316, it may be located anywhere within spectrum GUI 204 or, in some embodiments, anywhere in model display GUI 104 or elsewhere. Each of the interactive features of spectrum GUI 204, including without limitation spectrum features 328, 332, marketplace tools buttons 320, viewer tools buttons 312, or done button 336 may be voice-activated as further disclosed herein. View window 340 may display a current view CAD model 224, at least a selected modification to current view of CAD model 224, at least a modification to CAD model 224, or any other interaction between a user and CAD model 224 according to methods disclosed herein.

In an embodiment, in addition to modifications to spectrum tools and/or CAD model 224, model display GUI may enable one or more designers to post project designs and associated requests for pricing (not shown) to a marketplace, here electronic model display GUI 104, accessible by one or more purchasing agents and suppliers, such as supplier 264, that may review designs and place prices on the work associated with the creation of one or more project designs. Model display GUI 104 may include software that enables communication between/among designers, suppliers, purchasing agents, and/or others and may include, for example, one or more stand-alone or add-on programs (e.g., for use with a CAD program or other programs), one or more websites, a distributed or decentralized network, and/or a peer-to-peer network, among other known types of networks, servers, clients, and programs/add-ons. Notably, in some embodiments, Model display GUI 104 may implement all of the steps of a method as described herein, though in other embodiments other components, such as a marketplace client or add-on program, may implement one or more steps.

In use, a designer may upload or otherwise communicate one or more requests for pricing, which may include one or more design documents and/or specifications, to model display GUI 104. In some embodiments, a designer may interact with model display GUI 104 via a CAD program, which may include one or more individual programs and may be augmented with non-CAD programs such as, for example, a marketplace client that may, by default, lack one or more capabilities of typical CAD programs, such as the ability to design or modify computer models. CAD program used by designers may include any CAD program 106 accessed using natural language features described above. Designers may use a CAD program to design virtual computer models and/or to generate data to send to model display GUI 104 and/or a designer database 260. For example, a designer may upload a request for pricing including information associated with a CAD model design and/or project from a CAD program to designer database 260, which may then communicate the information or otherwise make the information available to model display GUI 104. In some embodiments, a CAD program may communicate directly with model display GUI 104. One or more suppliers, such as supplier 264, may then interact with model display GUI 104 to place prices on one or more designs included in or otherwise accessible by the marketplace.

In operation, a designer may upload a request for pricing including information associated with a CAD model design and/or project from a CAD program to designer database 260, which may then communicate the information or otherwise make the information available to model display GUI 104. Similarly, a supplier 264 may upload capability data reflecting its manufacturing capabilities to supplier list database 270 via a supplier upload data link, which may transmit or otherwise make available the capability data to model display GUI 104, either immediately or in response to a supplier, designer, purchasing agent, or other request. A user, such as a purchasing agent or supplier, may access information stored in model display GUI 104, such as one or more CAD model designs, via spectrum GUI 204. Alternatively, a CAD model design may be stored elsewhere and may be accessed by a third party via spectrum GUI 204 in order to make changes to the design and/or request a price for the design via model display GUI 104.

Figure 4:
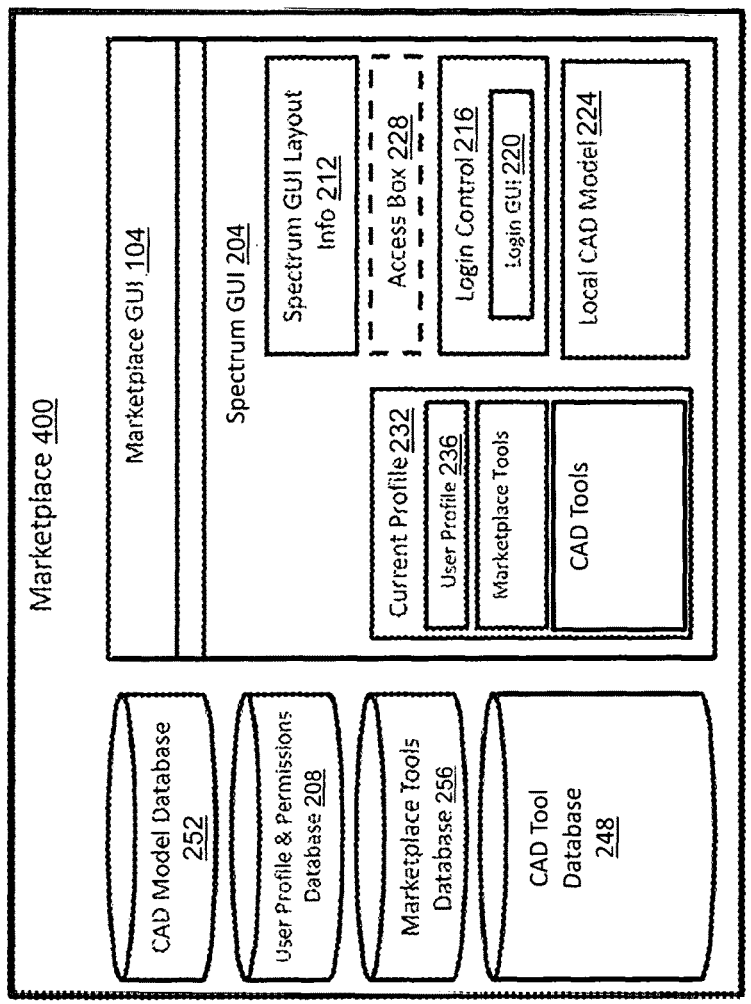
FIG. 4 is a block diagram illustrating further details of a marketplace system and a spectrum interface.

As illustrated for example in FIG. 4, one or more elements described above in reference to FIGS. 2-3 may be incorporated in a marketplace 400. In some embodiments, marketplace 400 may receive one or more projects posted by one or more designers and allow one or more purchasing agents and/or suppliers to review, place custom pricing on, and/or compete for posted projects. marketplace 400 may include model display GUI 104, which may further include software allowing for interaction between a user and the marketplace. In one example, marketplace 400 may implement model display GUI 104 in the form of a display presenting default marketplace features and an interface allowing a user to access spectrum GUI 204.

Figure 6:
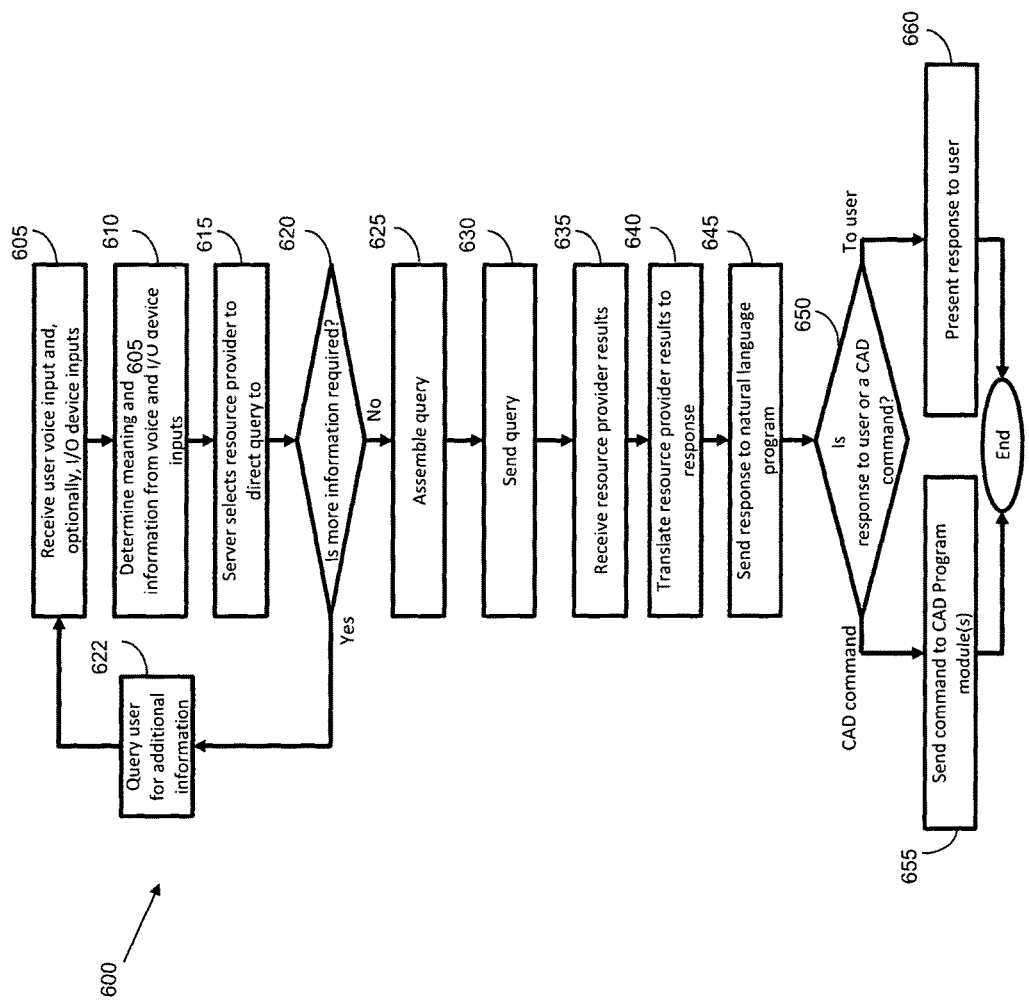
FIG. 6 is a flow diagram illustrating another embodiment of a method according to the present invention with more detail.

Operation of embodiments of the present invention may be further understood with references to the flow diagrams in FIGS. 5, 6, and 7. FIG. 5 illustrates a high-level method comprising five general steps. Step 505 includes receiving user natural language and input/output device inputs, in other words the user speaks and may also use keyboard or mouse to highlight. For example, a user may say "I need a bolt to fit this hole" while using the mouse to identify the hole and natural language command program module 110 will appropriately associate the two different types of inputs based on context and proximity in time. For example, the context of the parse can include recognition of keyboard/mouse commands such as "make this <highlighted with mouse>, aluminum." In a further alternative, distinct commands may be assigned to correspond to the mouse or keyboard commands so that context is not required, for example, predetermining that spoken "this" plus an immediate physical I/O action go together.

Step 510 includes parsing the natural language inputs to determine meaning and required information. Step 515 includes analyzing CAD model 120 for required information, typically using CAD model analyzer 114. Step 520 includes determining actions to be carried out, for example determining results using resource provider server modules or databases as described above. Step 525 includes carrying out the action or actions or delivering results to the user.

More detailed method steps are described in connection with the embodiment shown in FIG. 6. In this embodiment, a first step 605 includes receiving a user voice input and optionally input/output device input as described. In step 610 the meaning of voice and I/O device inputs is determined. More detail on this step is provided in the discussion of FIG. 7 below. Next, at step 615, server module 122 selects a resource provider server module 132 to which the query is to be directed.

Step 620 requires a determination of whether more information is required. If YES, step 622 generates a query to the user to provide additional information and program flow returns to step 605 upon information receipt. If NO, program flow continues on to step 625. In step 625 the query is assembled and then sent in step 630. In step 635 resource provider results are received from either or both of the resource provider server module or databases. Step 640 includes translating the resource provider results to a response in a form useable by the CAD system. In step 645, the translated response is sent to the natural language command program module.

Step 650 requires another determination, in this case whether the returned response is a CAD command or a response to be directed to the user. In other words, is the response something that is intended to seek feedback or find answer from the user, or is it really a CAD command that should be going into the CAD program 106 for execution? If a CAD command, it is routed at 655 for execution by a CAD program module; if a user response, it is routed at 660 to an appropriate I/O device for communication with the user.

Turning now to FIG. 7, more detail of the command meaning determination in step 610 above is provided. The process in this embodiment begins at step 705 with receiving user voice input and optionally I/O device input, in this case the same as step 605. Next, in step 710, the voice input is parsed to determine the meaning as is generally understood by persons skilled in the art of natural language program interfaces. In step 715, required CAD model information corresponding to as determined CAD-related command topics is further determined. In step 720, CAD model features are analyzed (for example, by CAD model analyzer 114) for required CAD model information. Thereafter, in step 725, CAD model data and optionally voice input are sent to the natural language program server module for further action as elsewhere described herein.

FIG. 8 illustrates exemplary contents of CAD Context Database 800 in an abbreviated form suitable for representation within the drawings of a patent application. As will be appreciated by persons of ordinary skill, the contents of a CAD context database as described herein will in practice be substantially more voluminous. In the examples illustrated in the figures provided herewith, CAD Context Database 800 is located within natural language program server module 122. However, it may be otherwise located without departing from the scope of the invention.

As illustrated in the example of FIG. 8, CAD Context Database 800 includes a series of command topics in a first column and at least two super-columns thereafter that identify required information and corresponding search addresses or locations for information corresponding to each command topic. In this example, a "Yes" entry in any column indicates applicable or required information, and an "X" entry indicates that information is not required or not applicable. The required information super-column indicates each specific type of information that CAD analyzer 114 must pull from CAD model 120 to respond to a command related to the indicated topic or which must be obtained from a resource provider or other third-party source. The search address super-column indicates applicable sources associated with each topic from which the required information may be potentially obtained. In this example, for illustration purposes, the search address columns have been populated with a number of well-known industrial suppliers—McMaster Carr, PEM and Metal Depot—but any source of information appropriate for the particular structures to be made may be populated in the search address columns. Also, when formula-based calculations are required, as explained in further detail below, the source of the formula may be a memory location or calculation engine located within the system or internally networked, in addition to third party or cloud sources.

Figure 9:
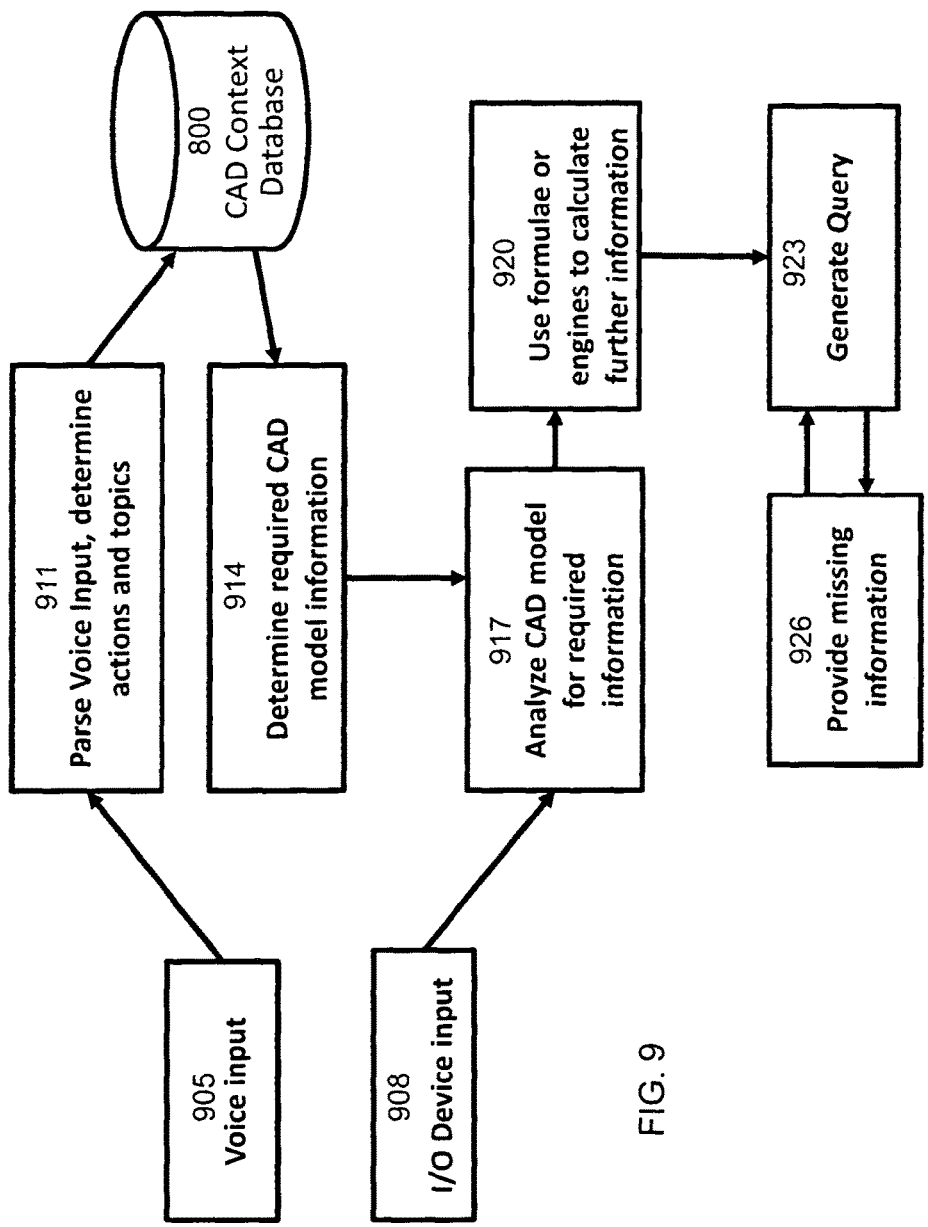
FIG. 9 is a flow diagram illustrating one possible embodiment of a query generation algorithm according to the present invention.

The information thus provided by CAD Context Database 800 is used to generate search queries, for example as shown in FIG. 9. The flow diagram of FIG. 9 illustrates one possible algorithm for query determination according to embodiments of the present invention, which will be illustrated by two examples with reference to FIG. 9 and Table 1 below. In step 905, a voice input is provided, such as "Nalcop, can you find a bolt to fit the selected hole?" Simultaneously or at a time in close proximity to the voice input, a device input is also provided in step 908. This device input may, in this example, be mouse clicking on a hole in the displayed structure from the CAD model. Next, at step 911 the voice input is parsed to determine actions, topics and required information. In this example, bolt as a topic returns needed information such as diameter, length, and material. This information is returned from CAD Context Database 800 as described above.

Based on information returned from CAD Context Database 800, at step 914, a determination is made as to the required CAD model information. In this example, required CAD information includes hole diameter, the material, and thickness of material at the hole location. With this information, at step 917, the CAD model is analyzed to extract the required information. In this example, extracted information may be diameter=0.5 in, thickness=1.5 in to 2.0 in, and material=aluminum. Once required information is returned, at step 920, formulae or engines are accessed and applied as needed to calculate further required information. In this example, max bolt diameter might be calculated at 0.95 in and minimum bolt length at 1.1 in.

With all necessary information in hand, a query is generated at step 923. A hypothetical query for this example may include the following fields and corresponding information: Address: McMaster Carr catalog; Action: search—Term 1: "bolt"—Term 2: "diameter=0.950 in"—Term 3: "length>1.65 in to 2.2 in"—Term 4: "material=aluminum". To the extent any information is determined to be missing, it is provided at step 926. For example, the length of fitting parts could be much longer than thickness of material, leading to many possible fitting results, in which case the natural language command program module will ask the user "What length part do you want?"

Table 1 below shows how the initial search request—"Nalcop, can you find a bolt to fit the selected hole?"—is parsed and the associated program actions and other associated events that flow from the request.

TABLE 1

| | "Nalcop" | "can you find" | "a bolt" | "to fit" | "the selected" | "hole?" |
|---|---|---|---|---|---|---|
| Parsed Voice Input | | | | | | |
| I/O Device Association | N/A | N/A | N/A | N/A | "selected" = identify I/O device input for selected feature | N/A |
| Program Actions and Topics | "Nalcop" = Activate natural language program interface | "you find" = Action will be a search | "bolt" = Recognize CAD Context Term; Retrieve Term-Specific parameters for search from CAD Context Database | Identify selected feature and determine associated parameters (e.g. hole diameter, depth & surrounding material) Construct query: "fit . . . selected hole" [verb + direct object] = correlate feature parameters (e.g. hole diameter, depth & surrounding material) with CAD Context Term Specific Parameters (e.g. bolt diameter, length & material) and other purchased parts compatibility data. | | |
| CAD Context Database Interaction | N/A | N/A | Supply Term-Specific Parameters (for bolt, e.g., diameter, length, material) | N/A | N/A | |

TABLE 1-continued

| | | | | |
|---|---|---|---|---|
| Resource Provider Extension Actions and Topics | N/A | Search | Address = McMaster Carr catalog<br>Search term = bolt | Required corresponding CAD-interrogated information used to narrow search (e.g., Search term = diameter of hole; Search term = material; Search term = thickness of material) |

A second example follows that illustrates a variation of parameters when the request is for a stud rather than a bolt:

905 Voice Input—"Nalcop, can you find a stud to fit the selected hole?"

908 I/O Device Input—Mouse clicks on a hole

911 Parse Voice Input and determine actions and topics (Stud=diameter, length, material) by accessing CAD Context Database 800

914 Determine required CAD model information (CAD information=diameter of hole, thickness of material, material)

917 Analyze CAD model for required information (Diameter=0.25 in Thickness=0.090 in Material=Aluminum)

920 Use formulae or engines to calculate further information (Diameter+/−0.10 in Thickness=1-0.007 in)

923 Generate Query Addresses (PEM catalog Action: search—Term 1: "stud"—Term 2: "diameter=0.15 in to 0.35 in"-Term 3: "thickness=0.083 in to 0.097 in"-Term 4: "material=aluminum")

926 Provide missing information (After query is executed, the length of the stud can be variable and independent of the part being analyzed, leading to many possible choices. NLCP Module 110 asks, "Is there a specific length stud you want?" This information is then added to the query as Term 5 and the query is executed again)

Figure 10A:
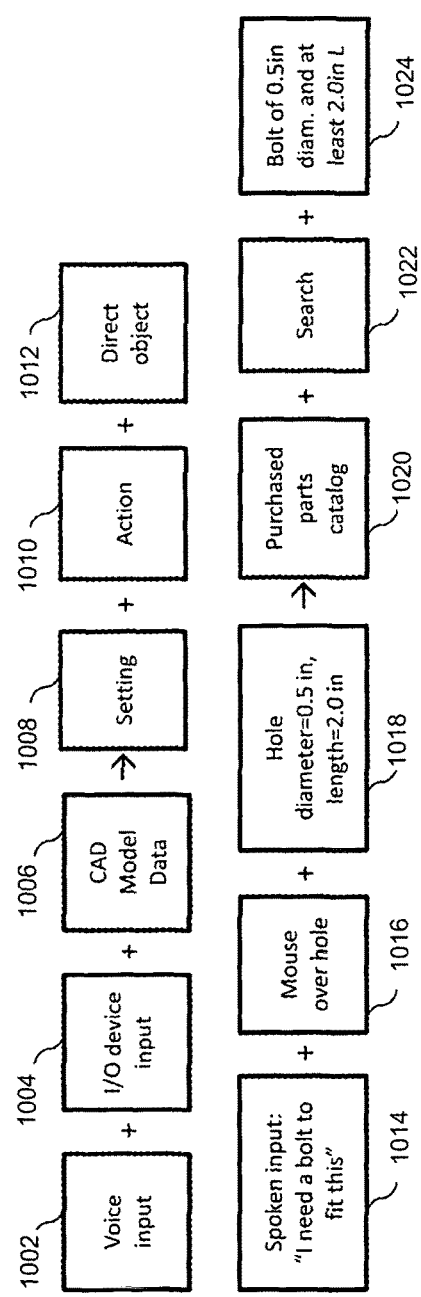
Figure 10B:
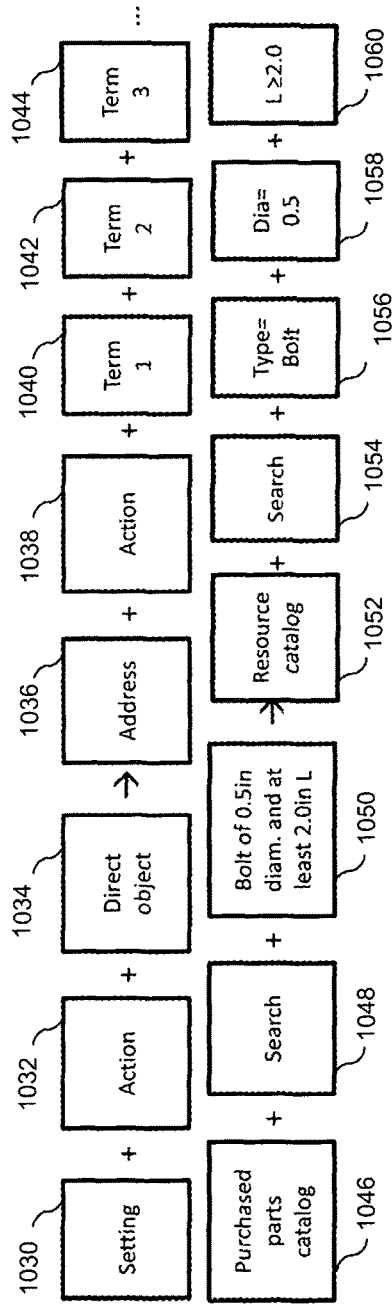

FIGS. 10A and 10B illustrate further alternative parsing and query algorithms, respectively, according to alternative embodiments of the invention. In each figure there are generic steps along the top row and a specific example in the boxes of the bottom row. In this alternative parsing algorithm there is voice input 1002 plus I/O device input 1004 plus CAD model data 1006 that is the basis for output setting 1008 plus action 1010 plus direct object 1012. The corresponding specific examples are, respectively, the voice input of natural language command program module 110 is "I need a bolt to fit this" 1014 and mousing over the hole as I/O device input 1016 plus CAD model data the hole diameter is half an inch and length is two inches 1018, is the basis for a setting of purchased parts catalog 1020, an action of search 1022, and then the direct object or the search terms is "bolt of half an inch diameter and at least two inches length" 1024.

The setting, action and object thus determined forms inputs to the query algorithm shown in FIG. 10B, wherein the setting 1030 plus action 1032 plus direct object 1034 generate an address 1036 plus action 1038 plus search term(s) 1040-1044. These generic algorithm steps correspond, in this specific example, to, respectively, an actual query of purchased parts catalog 1046 plus search 1048 plus Bolt of 0.5 in diameter and at least 2 in length 1050, provides a specific address of a resource catalog 1052, a specific action of the search 1054 and three search terms 1056, 1058 and 1060 that come out of the direct object.

In one further embodiment, a local sub-server may be provided with specialized language databases that apply only to a group of designers so that the group may create or use their own individualized glossary commands and terms that might not be used by others outside the group and thus would not parse correctly. This would allow, for example, the users of that group to drop common adjectives from names when all parts have that name. For example, if all bolts were red, it would not be necessary for users within the identified group to specify a red bolt because the system would know the bolt color was red unless otherwise stated.

In another embodiment, a voice recognition sub-module may be included within natural language command program module 110 so that commands can be locked out from unrecognized voices to permit only authorized users to edit the CAD model. For example, such functionality may help to prevent untrained users from changing the CAD model inadvertently. Also, further functionality may be added to permit response by the system in natural language to questions about why a specific command or operation is not working. For example, if an initial command includes a request to add a steel bolt to an aluminum structure and the system does not allow it because steel fasteners pull through the aluminum, the natural language command program module 110 would respond with an error message or say "this won't work" in audible tone all of the words—"this won't work for these reasons." This could be very helpful to users, especially for those people learning as they make mistakes and understand why it's wrong not just that it's wrong.

Another alternative embodiment may present help menu material tutorials as a natural language response, effectively reading the manual, so that, for example, the user may concentrate on the actions necessary with the keyboard and mouse without diverting his eyes to read from the screen.

Figure 11:
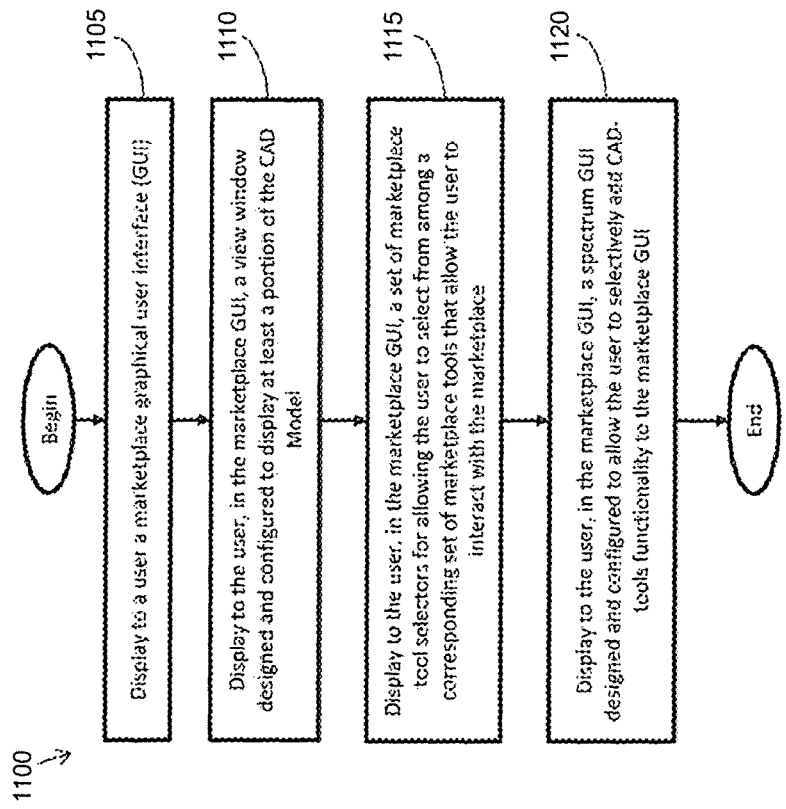
FIG. 11 is a flow diagram illustrating a method of requesting a pricing in an electronic marketplace using a user-modifiable spectrum interface.

Referring now to, FIG. 11, an exemplary method 1100 of requesting a pricing in an electronic marketplace 400 as disclosed above is illustrated. One or more systems made in accordance with the description above may implement aspects of method 1100 Exemplary method 1100 may begin with step 1105, at a model display GUI 104 is displayed to a user, such as, for example, a purchasing agent or a supplier. This displaying of the model display GUI 104 may be performed by, for example, system 100, or by marketplace 400 as described above. At step 1110, the software may display to the user a view window, which may be view window 200 designed and configured to display at least a portion of a locally or remotely stored CAD model. The software may display view window 200, for example, in the model display GUI 104. At step 1115, the software may display a set of marketplace tool selectors for allowing the user to select from among a corresponding set of marketplace tools that allow the user to interact with the marketplace to the user in the model display GUI 104. At step 1120, the system(s) may display a spectrum GUI, such as spectrum GUI 204 to the user in the model display GUI 104. As alluded to above, spectrum GUI 204 may be designed and configured to allow a user to selectively augment the functionality of model display GUI 104 by adding CAD-tool functionality and/or other functionality typically associated with fully featured CAD programs, such as tools a user may utilize to alter the geometry of, change the material and/or finish of, and/or change purchased components associated with one or more CAD models or designs.

Figure 12:
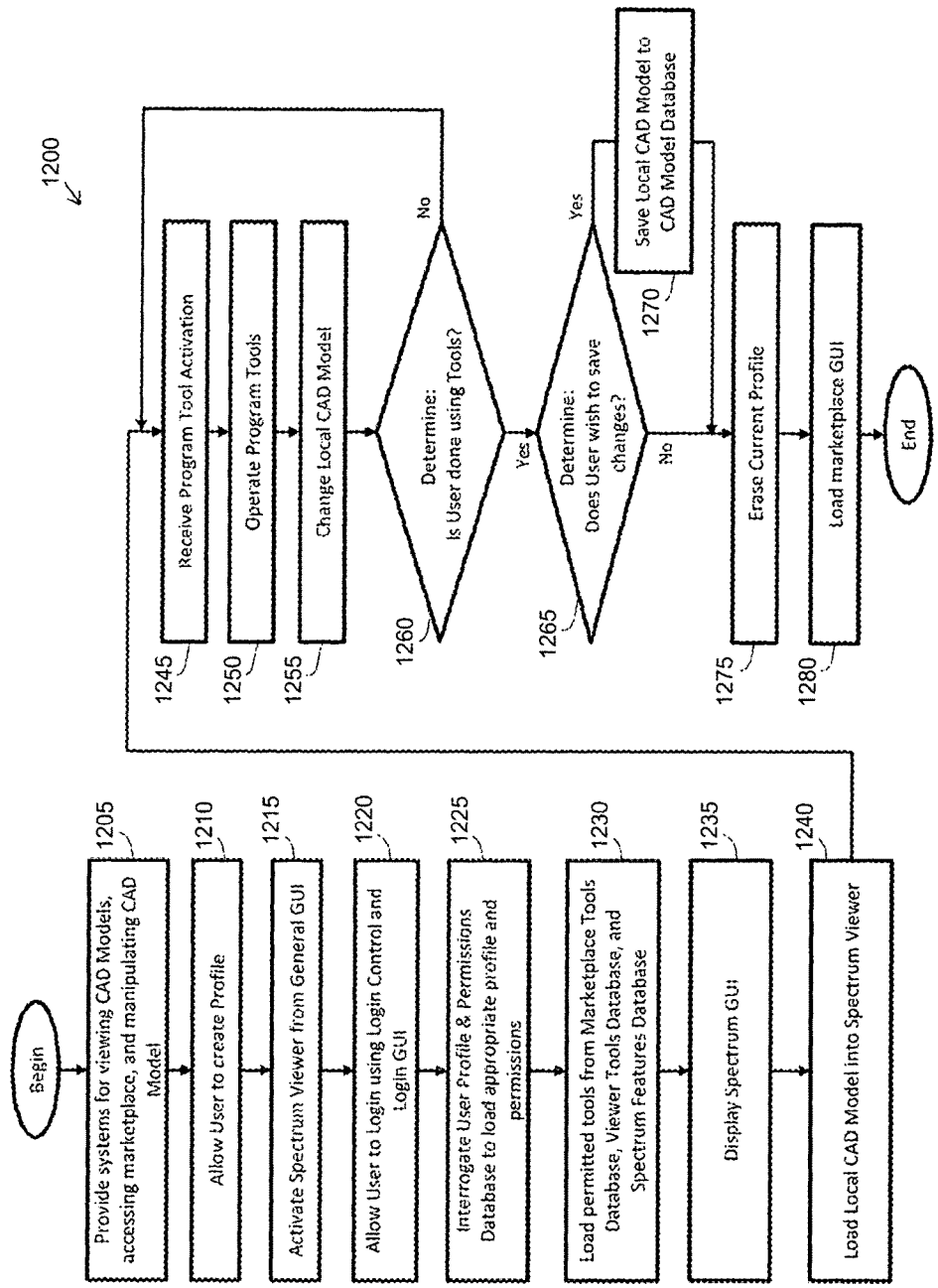
FIG. 12 is a flow diagram illustrating a method of providing a spectrum interface to users of an electronic marketplace.

FIG. 12 illustrates a method 1200 for providing a viewer to users of an automated marketplace 400 according to exemplary aspects of the invention that can be implemented by one or more components of system 100 of FIG. 2, as appropriate. In this example, at step 1205, one or more systems for viewing CAD models, accessing model display GUI 104, and manipulating CAD models may be provided. In some embodiments, step 1205 may include providing system 100 of FIG. 1 or model display GUI 104.

At step 1210, a user may create a profile using, e.g., model display GUI 104, spectrum GUI 204, and/or Login GUI 220, which model display GUI 104 and/or spectrum GUI 204 may then store in user profile and permissions database 208. The user's profile may contain information indicating tools or functionality that the user has access to in marketplace tools database 256 and/or CAD tool database 248. In some embodiments, model display GUI 104 may allow multiple profiles for each individual user. Each profile may specify particular tools that the associated user has purchased or otherwise gained access to using access box 228. In some embodiments, model display GUI 104 may provide a default set of tools to each user.

At step 1215, a user may manipulate model display GUI 104 in order to to activate spectrum GUI 204. In some embodiments, a user may click on or otherwise select a button in model display GUI 104 in order to activate spectrum GUI 204, while in other embodiments the model display GUI 104 may activate the spectrum viewer when a user loads or imports a CAD file into model display GUI 104; model display GUI 104 may also activate spectrum GUI 204 in response to a voice command, which may be processed as disclosed above. At step 1220, spectrum GUI 204 may activate login control 216 and login GUI 220 such that a user may log in by providing identifying information to the login control and login GUI 220. At step 1225, one or more of model display GUI 104, spectrum GUI 204, and login control 216 may interrogate user profile and permissions database 208 to verify the user's credentials and, in the event of a positive match, may store a profile associated with the user and any permissions associated therewith in current profile 232.

At step 1230, spectrum GUI 204 may load one or more tools the user is permitted or authorized to use from marketplace tools database 256 and/or CAD tool database 248 into current profile 232. In addition, the user may optionally access additional tools or features via access box 228. At step 1235, spectrum GUI 204 may display to the user. spectrum GUI 204 may include icons and/or softselection buttons representing each of marketplace tools and CAD tools to which a user profile has access, and the spectrum GUI 204 may display each tool or feature according to the information contained in spectrum GUI layout information 212.

At step 1240, spectrum GUI 204 may load a CAD model, though in some embodiments spectrum GUI 204 may already contain one or more CAD models; spectrum GUI 204 may load a view of the CAD model. In one example, spectrum GUI 204 may prompt a user to select a CAD model to load from CAD model database 252, another memory location, a networked location, or other appropriate data storage. At step 1245, a user may manipulate spectrum GUI 204 to activate one or more tools or functions, such as one or more of marketplace tools and/or CAD tools via, e.g., soft-selection buttons and/or icons located in the spectrum GUI. For example, spectrum GUI 204 may receive an indication from a user requesting activation of a "rotate" viewer tool, a "request for pricing on this project" marketplace tool, or a "change material" spectrum feature in the form of a user selection of an appropriate button in the spectrum GUI. In some embodiments, these tools may not be accessed by the same user.

At step 1250, a user may operate one or more program tools, such as the tool or feature selected in step 1245. For example, the user may manipulate a change material spectrum feature to indicate a change from stainless steel to aluminum. In some embodiments, the user may operate two or more tools or features simultaneously. At step 1255, the user may save any modifications they have made to CAD model 224 by manipulating appropriate portions of spectrum GUI 204; for instance using voice controls as described in further detail below. At step 1260, spectrum GUI 204 determines whether the user has finished using the spectrum viewer, which may involve the spectrum viewer receiving an indication of a user selection of a "done" soft selection button. If spectrum GUI 204 determines that the user has finished using spectrum GUI 204, method 1200 may proceed to step 1265; if the user is still working with the spectrum viewer, method 1200 may return to step 1245.

At step 1265, spectrum GUI 204 determines whether the user wishes to save any changes they have made to CAD model 224, which may involve the spectrum viewer receiving an indication of a user selection of a "save" soft selection button. If spectrum GUI 204 determines that the user wishes to save changes, method 1200 may proceed to step 1270; otherwise, method 1200 may proceed to step 1275. At step 1270, spectrum GUI 204 may store CAD model 224, including any modifications or updates the user has made, to CAD model database 252, either by overwriting an associated model (e.g., a previous edition of the CAD model) or by saving the information in a new location.

At step 1275, spectrum GUI 204 may clear current profile 232 to protect the security of a user's profile and information. Step 1275 may include wiping of browser caches or affirmative/secure deletion of hard drive information, among other such known security features. At step 1280, spectrum GUI 204 may cease to display spectrum GUI 204 and model display GUI 104 may reload such that the same user or a subsequent user can interact with model display GUI 104 and/or activate spectrum GUI 204.

Figure 13:
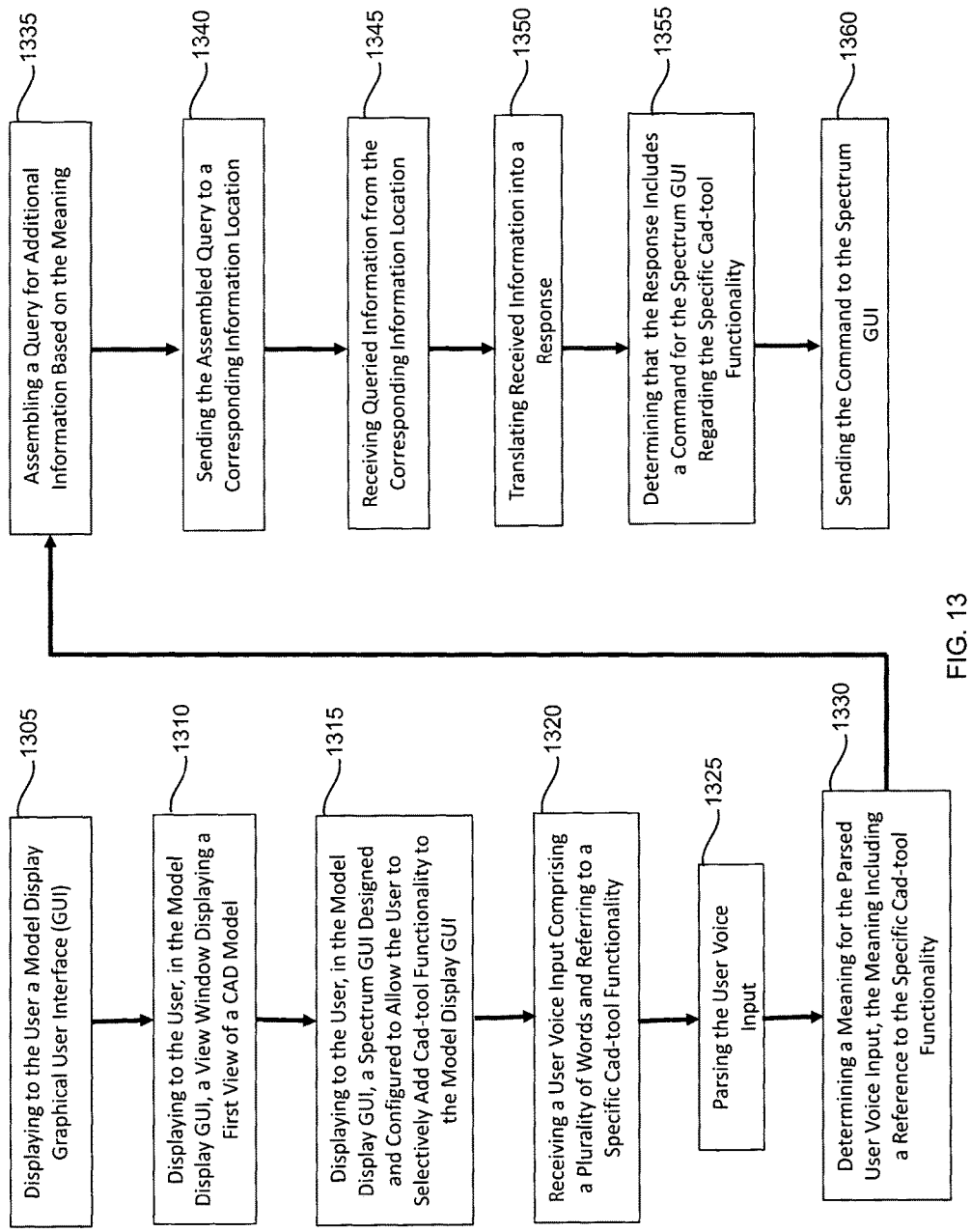
FIG. 13 is a flow diagram illustrating an exemplary method of providing a natural language interface for a computer-aided design (CAD) system.

Referring now to FIG. 13, a method 1300 of providing a natural language interface for a computer-aided design (CAD) system is disclosed. At step 1305, a model display GUI 104 is automatically displayed to a user. Model display GUI 104 may be any model display GUI 104 as described above in reference to FIGS. 1A-12. Displaying model display GUI 104 may include transmitting instructions to a client device, such as a computing device running a web browser or end-user application, to display one or more elements of model display GUI 104 locally; this may be performed according to any architecture for applications implemented across networks. Displaying model display GUI 104 may be performed locally to the computing device, for instance using I/O devices coupled to the computing device. Model display GUI 104 may be displayed on more than one device simultaneously. In some embodiments, model display GUI 104 is displayed as part of a marketplace 400 as described above, which may be an electronic marketplace.

At step 1310, with continued reference to FIG. 13, a view window 200 displaying a first view of a CAD model is automatically displayed to the user. View window 200 may be any view window 200 as described above in reference to FIGS. 1A-12. CAD model may be any CAD model 120 or CAD model 224 as described above. View window 200 may, for instance, receive only first view from memory 118, which view window 200 may display; view window 200 may alternatively display a first view of CAD model 224 stored in model display GUI 104. Persons skilled in the art will be aware, upon reading the whole of this disclosure, of many alternative ways that CAD model and/or views of CAD model may be distributed between elements of system 100 and to client devices.

Still referring to FIG. 13, at step 1315, a spectrum GUI 204 designed and configure to allow the user to selectively add CAD-tool functionality to the model display GUI is automatedly displayed to the user. Spectrum GUI 204 may be any spectrum GUI 204 as described above in reference to FIGS. 1A-12; spectrum GUI may be displayed according to any functionality or process described above for displaying a spectrum GUI 204. Selectively adding CAD-tool functionality may include without limitation selectively adding CAD tools, including without limitation viewing tools and CAD manipulation tools. Selectively adding CAD-tool functionality may include selectively adding any marketplace tool.

At step 1320, a user voice input comprising a plurality of words and referring to a specific CAD-tool functionality is automatedly received. Receiving a voice input may be performed according to any process or functionality described above in reference to FIGS. 1A-12, including without limitation receiving via an I/O device and receiving the voice input via a client device or other remote computing device. Command regarding the specific CAD-tool functionality may include a command to selectively add the specific CAD-tool functionality. Command regarding the specific CAD-tool functionality may include a command to selectively add a viewing tool. Command regarding the specific CAD-tool functionality may include a command to selectively add a CAD manipulation tool. Command regarding the specific CAD-tool functionality may include a command to selectively remove the specific CAD-tool functionality. In an embodiment, and as discussed further above, the ability to selectively add or remove CAD-tool functionality may enable a user to customize spectrum GUI 204 to contain features user wishes to have, without features user does not wish to have, improving performance of the user's client device by providing the user with an uncluttered view of model display GUI 104 and by avoiding waste of computational resources displaying and implementing unneeded features. System 100 may similarly function more efficiently and more accurately by attempting to use only CAD-tool functionality that is activated. The ability to activate or remove CAD-tool functionality in a voice-activated manner may further simplify and make more efficient model display GUI 104 by obviating the need to display current profile 232 or user profile 232 so that user can visually select CAD-tool functionality to add; user may simply call for CAD-tool functionality to add verbally.

Continuing to refer to FIG. 13, command regarding the specific CAD-tool functionality may include a command to perform an action using the specific CAD-tool functionality. Command to perform an action using specific CAD tool functionality may include a command to modify the first view using a viewing tool. Command to perform an action specific CAD tool functionality may include a command to be performed using any marketplace tool functionality, including without limitation creating, submitting, or responding to a pricing request as described further herein and in documents included herein by reference. Command to perform an action specific CAD tool functionality may include a command to modify the CAD model using the CAD manipulation tool. Receiving a command to modify the CAD model may also include receiving a user selection of a particular location of the displayed first view of the CAD model; user selection may be received as part of voice input, or by other means such as selection using a mouse, keyboard, touchscreen, or the like. Receiving the voice input may also include receiving a reference to a specific item; specific item may be any specific item as described above, including without limitation a geometric modification to be performed on CAD model, a component to be added or removed from CAD model, or the like.

At step 1325, and still referring to FIG. 13 the user input is automatedly parsed. This may be performed as described above in reference to FIGS. 1A-12. Parsing may be performed by any parser 112 or 126 as described above. At step 1330, a meaning for the parsed user voice input is automatedly determined, the meaning including a reference to the specific CAD-tool functionality. The determination of meaning for the parsed user voice input may be performed according to any process or functionality described above in reference to FIGS. 1A-12; for instance, meaning may be determined by reference to CAD context database 144 to resolve ambiguities. Determining meaning for parsed user voice input may include determining one or more words associated with one or more program actions related to the specific CAD-tool functionality; this may be implemented as described above in reference to FIGS. 1A-12. Determining a meaning for the parsed user voice input may include determining one or more command topics related to the specific CAD-tool functionality, for instance according to processes and/or functionalities described above in reference to FIGS. 1A-12.

Continuing to refer to FIG. 13, in some embodiments determining meaning includes determining that information is missing. For instance, parser 112 may fail to produce any intelligible word from voice input. Parser 112 may produce from voice input one or more words that do not convey material meaning in themselves, such as articles, negations, or conjunctions. Parser 112 may not produce any words that may be linked to a particular program action. Determining meaning may include determining that voice input is missing information. User may be prompted for missing information; prompting may be performed by any output means, including without limitation display of a visual prompt and/or issue of an audio prompt. User may enter a response; response may include a second voice input, which may be parsed to produce one or more additional words, which may be combined with the results of parsing the original voice input. Meaning determination may then be repeated with the combined results. User may enter response through other input means such as selecting displayed options using a mouse or touchscreen, or typing or otherwise entering verbal information.

Still referring to FIG. 13, in some embodiments, where a user selection of a specific item has been received, computing device may automatically identify information including one or more specifications for the specific item; this may be performed using CAD context database 144. Where user has entered a particular location as described above, identifying information may be performed using both the particular location and specific item. One or more specifications may include a plurality of specifications. One or more specifications may include, without limitation, a diameter, a length, a depth, a thickness a material, or any other physical property of specific item. Identifying information may be performed for instance as disclosed above in reference to FIGS. 1A-12.

At step 1335, and with continued reference to FIG. 13, a query for additional information is automatically assembled based on the meaning. Query may be generated according to any process and/or functionality described above in reference to FIGS. 1A-12. Where information including one or more specifications for a specific item has been identified as described above, assembling query may further include assembling a query based on at least the identified information; query may be assembled based on the identified information combined with meaning determined as described above, on identified information combined with CAD model, or based on the identified information, the meaning, and the CAD model.

Still referring to FIG. 13, at step 1340, the assembled query is automatically sent to a corresponding information location. Corresponding information location may include any location to which a query is submitted as described above in reference to FIGS. 1A-12, including without limitation resource provider server module 132, natural language program server 122, CAD model database 252, marketplace tools database 256, designer database 260, supplier list database 270, CAD tool database 248, current profile 232, user profile and permissions database 208, or any other location in any memory containing information useable to return query results as described herein.

Continuing to refer to FIG. 13, corresponding information location may include a plurality of locations; for instance, information responsive to query may be received in part from resource provider 132 and in part from CAD tool database 248. Query may be modified using information returned from a first information location and used to query a second information location; for instance, where first information location returns information identifying a particular command to modify CAD model, the information identifying the command may be submitted to CAD tool database 248 to determine a CAD tool that performs the command, and/or to current profile 232 to determine whether the command corresponds to a CAD tool available through spectrum GUI 204, whether command corresponds to a CAD tool currently added to spectrum GUI 204, and whether the user has permission to selectively add and/or use that CAD tool. Persons skilled in the art, upon reading the entirety of this disclosure, will be aware of many ways in which information from various corresponding information locations may be combined.

At step 1345, and still referring to FIG. 13, queried information is automatically received from the corresponding information location. This may be implemented according to any process and/or functionality described above in connection with FIGS. 1A-12. As further discussed above, queried information may be used to generate further queries to at least a corresponding information location. In some embodiments, system 100 determines from one or multiple query results that information necessary to perform a command requested in the voice input is missing; for instance, query may find no information corresponding to the command, or may find that the information is presented ambiguously, and that query responses do not resolve the ambiguity. As above, user may be prompted to enter missing information.

Continuing to refer to FIG. 13, at step 1350, the received information is automatically translated into a response. Automatic translation into a response may be performed using any process and/or functionality as described above in reference to FIGS. 1A-12.

At step 1355, with continued reference to FIG. 13, the system 100 automatedly determines that the response includes a command for the spectrum GUI regarding the specific CAD-tool functionality. System 100 may determine that command relates to specific CAD-tool functionality by querying CAD tool database 248, marketplace tools database 256, or other locations identifying CAD-tool functionality and/or relationships of CAD-tool functionality to commands. Determining that command relates to specific CAD-tool functionality may further include determining that the response is missing information; determination that response is missing information may be performed as described above. Computing device may prompt a user for the missing information, for instance as described above. A response may be received from the user in response to the prompt for missing information; response may be received in any manner for receiving a response to a prompt for missing information as described above. Command to spectrum GUI 204 may be provided on the additional information and the response from the user to the prompt for missing information. For instance, response from the user, or words extracted or parsed from the response, may be combined with the response to the query and the missing information may be determined from the combination. Response from the user may be added to a modified query as described above, which may produce a modified response to the query that contains the necessary information to determine the command to spectrum GUI 204.

Still referring to FIG. 13, determining that the response includes a command for the spectrum GUI regarding the specific CAD-tool functionality may include identifying a category of the command. Command may, for instance, be identified as a command to selectively add the specific CAD-tool functionality to spectrum GUI 204. Command may be identified as a command to selectively remove specific CAD-tool functionality from spectrum GUI 204. System 100 may check user profile and permission database 208 to determine whether user is authorized to selectively add and/or remove specific CAD-tool functionality; if user is not authorized, a message may be displayed to the user indicating that user does not have permission to add and/or remove specific CAD-tool functionality in spectrum GUI 204.

Continuing to refer to FIG. 13, determining that the response includes a command to modify CAD model with regard to a specific item as disclosed above may include determining that specific item is not compatible with one or more aspects of the CAD model when placed at the particular location; determining that the specific item is not compatible may be performed using any process and/or functionality as described above in reference to FIGS. 1A-12. System may further prompt the user for missing information as a function of the additional information based on the determination that specific item is not compatible; this may be performed in any manner or using any functionality disclosed above in reference to FIGS. 1A-12.

Still referring to FIG. 13, command may be identified as a command to perform an action using the specific CAD-tool functionality; for instance, command may be identified as a command to modify first view. Command may be identified as a command to modify CAD model. Command may be identified as a command to use one or more marketplace tools. System 100 may determine that the specific CAD-tool functionality is not currently activated in the spectrum GUI, for instance, by reference to current profile 232 and/or user profile 236. System 100 may activate CAD-tool functionality prior to performing the command to perform the action using the specific CAD-tool functionality; this may be performed automatedly, by creating or retrieving from a memory location the command to selectively add specific CAD-tool functionality. System 100 may first determine that user is authorized to access specific CAD-tool functionality, which may be performed using any process and/or functionality as described above in reference to 1A-12. Selectively adding specific CAD-tool functionality may be performed with user intervention; for instance, system 100 may display a message to the user indicating that the specific CAD-tool functionality is not currently activated. System 100 may receive a command from user activating specific CAD-tool functionality; system 100 may then activate the specific CAD-tool functionality, for instance by sending a command to activate to spectrum GUI 204 as described above.

At step 1360, and continuing to refer to FIG. 13, the command is automatedly sent to the spectrum GUI. Spectrum GUI 204 may perform command. For instance, where command is a command to selectively add or remove CAD-tool functionality, spectrum GUI 204 may selectively add or remove the CAD-tool functionality; this may be performed using any process and/or functionality described above in reference to FIGS. 1A-12. Activating CAD-tool functionality may include activating one or more CAD tools, such as viewing tools and/or CAD manipulation tools. Activating CAD-tool functionality may include activating one or more marketplace tools.

Still referring to FIG. 13 performing command may include performing an action using CAD-tool functionality. For instance, spectrum GUI 204 may perform a command to modify first view by modifying first view in view window 200, which may be performed as disclosed above in reference to FIGS. 1A-12. Performing the action may include modifying CAD model, which may be performed according to any process and/or functionality described above in reference to FIGS. 1A-12. Performing the action may include performing one or more marketplace activities, including without limitation algorithms to request pricing, determine pricing, or submit pricing information as disclosed above and as disclosed generally in the '008 application referred to above. System 100 may update view window 200 with respect to CAD model based on the command, for instance, by performing a medication to CAD model, generating a second view, and displaying second view in the view window 200; generation of second view, and display of second view, may be performed for instance as disclosed above for generation of first view.

Any step or sequence of steps described herein in reference to FIG. 13 may be performed or repeated iteratively. For instance, and without limitation, implementation of method 1300 may include iteratively querying as described above. As a further non-limiting example, a series of references to CAD-tool functionality may be identified, system 100 may perform any combination of steps 1325-1360, with any variations as disclosed above, with regard to each reference; thus, for instance, user may enter a series of commands to be performed in a single voice input, and system 100 may identify each of the series of commands using any method steps described above, and perform each command, in series or in parallel with other commands. As an illustrative and non-limiting example, a user may enter a single voice prompt directing system 100 to modify CAD model to represent a bolt-hole, to add to the CAD model a bolt having a particular part number inserted in the bolt-hole, and to add a nut to the bolt; system 100 may add the bolt-hole, then fail to find the part number in corresponding information location, prompting user to enter a corrected part number. Further continuing the example system 100 may then identify and perform the command adding the bolt, then determine that the nut is incompatible with the bolt, prompting the user to enter a different nut; as noted above, this prompt may be combined with a suggested alternative that system 100 determines is compatible. As a further example of iteration, where user enters a command modifying one of several features having an attribute in common, such as several identical features, several features compatible with the same component, or the like, system 100 may repeat commanded modification for all features; system may first prompt user to determine whether user wishes this iteration to be performed. System 100 may iteratively prompt user to enter modifications or corrections to commands as well.

It is to be noted that any one or more of the aspects and embodiments described herein may be conveniently implemented using one or more machines (e.g., one or more computing devices that are utilized as a user computing device for an electronic document, one or more server devices, such as a document server) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk (e.g., a conventional floppy disk, a hard drive disk), an optical disk (e.g., a compact disk "CD", such as a readable, writeable, and/or re-writable CD; a digital video disk "DVD", such as a readable, writeable, and/or rewritable DVD), a magneto-optical disk, a read-only memory "ROM" device, a random access memory "RAM" device, a magnetic card, an optical card, a solid-state memory device (e.g., a flash memory), an EPROM, an EEPROM, and any combinations thereof. A machine-readable medium, as used herein, is intended to include a single medium as well as a collection of physically separate media, such as, for example, a collection of compact disks or one or more hard disk drives in combination with a computer memory. As used herein, a machine-readable storage medium does not include a signal.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a personal digital assistant "PDA", a mobile telephone, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 14:
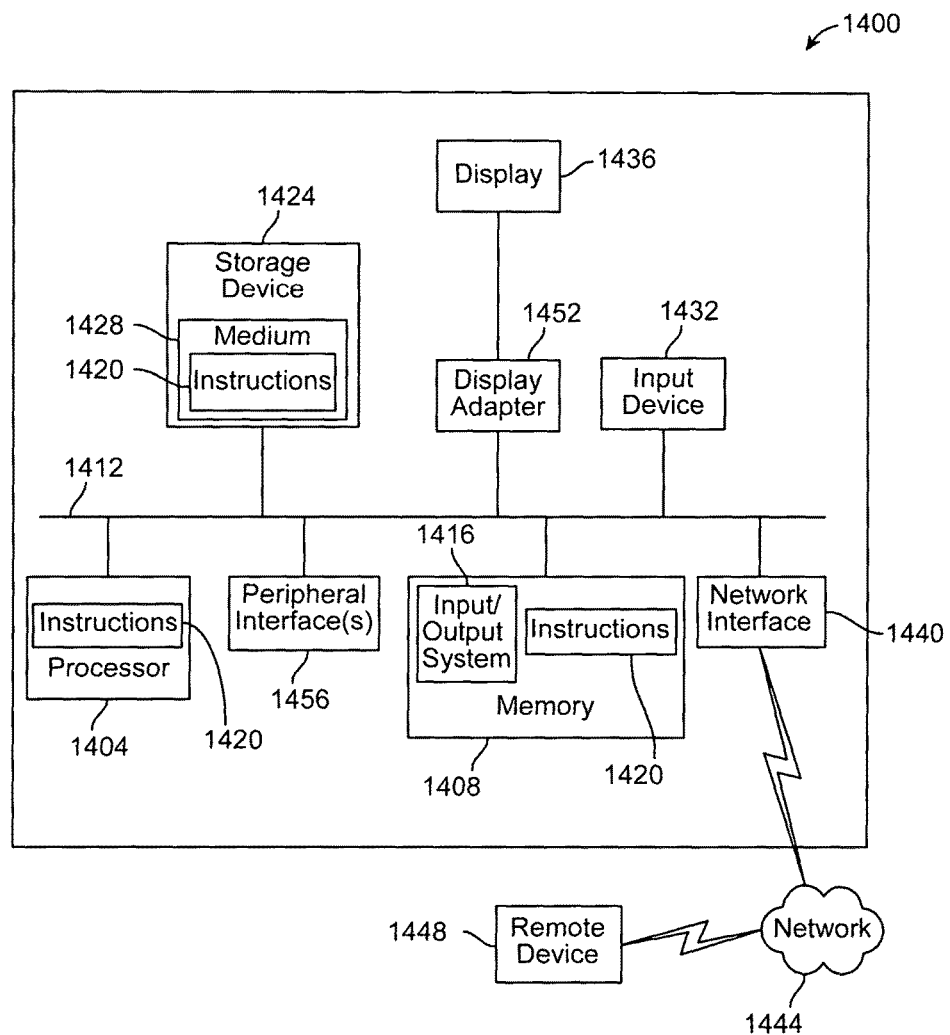
FIG. 14 is a block diagram schematically illustrating exemplary hardware implementations of embodiments of the present invention.

FIG. 14 shows a diagrammatic representation of one embodiment of a computing device in the exemplary form of a computer system or computing module 1400 within which a set of instructions for causing a control system, for example, system 100, sub-system 102 or CAD program module 106, to perform any one or more of the aspects and/or methodologies of the present disclosure may be executed. It is also contemplated that multiple computing devices may be utilized to implement a specially configured set of instructions for causing the device to perform any one or more of the aspects and/or methodologies of the present disclosure. Computer system or module 1400 includes a processor 1404 and a memory 1408 that communicate with each other, and with other components, via a bus 1412. Bus 1412 may include any of several types of bus structures including, but not limited to, a memory bus, a memory controller, a peripheral bus, a local bus, and any combinations thereof, using any of a variety of bus architectures.

Memory 1408 may include various components (e.g., machine readable media) including, but not limited to, a random access memory component (e.g., a static RAM "SRAM", a dynamic RAM "DRAM", etc.), a read only component, and any combinations thereof. In one example, a basic input/output system 1416 (BIOS), including basic routines that help to transfer information between elements within computer system 1400, such as during start-up, may be stored in memory 1408. Memory 1408 may also include (e.g., stored on one or more machine-readable media) instructions (e.g., software) 1420 embodying any one or more of the aspects and/or methodologies of the present disclosure. In another example, memory 1408 may further include any number of program modules including, but not limited to, an operating system, one or more application programs, other program modules, program data, and any combinations thereof.

Computer system 1400 may also include a storage device 1424. Examples of a storage device (e.g., storage device 1424) include, but are not limited to, a hard disk drive for reading from and/or writing to a hard disk, a magnetic disk drive for reading from and/or writing to a removable magnetic disk, an optical disk drive for reading from and/or writing to an optical medium (e.g., a CD, a DVD, etc.), a solid-state memory device, and any combinations thereof. Storage device 1424 may be connected to bus 1412 by an appropriate interface (not shown). Example interfaces include, but are not limited to, SCSI, advanced technology attachment (ATA), serial ATA, universal serial bus (USB), IEEE 1244 (FIREWIRE), and any combinations thereof. In one example, storage device 1424 (or one or more components thereof) may be removably interfaced with computer system 1400 (e.g., via an external port connector (not shown)). Particularly, storage device 1424 and an associated machine-readable medium 1428 may provide nonvolatile and/or volatile storage of machine-readable instructions, data structures, program modules, and/or other data for computer system 1400. In one example, software 1420 may reside, completely or partially, within machine-readable medium 1428. In another example, software 1420 may reside, completely or partially, within processor 1404.

Computer system 1400 may also include an input device 1432. In one example, a user of computer system 1400 may enter commands and/or other information into computer system 1400 via input device 1432. Examples of an input device 1432 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), touchscreen, and any combinations thereof. Input device 1432 may be interfaced to bus 1412 via any of a variety of interfaces (not shown) including, but not limited to, a serial interface, a parallel interface, a game port, a USB interface, a FIREWIRE interface, a direct interface to bus 1412, and any combinations thereof. Input device 1432 may include a touch screen interface that may be a part of or separate from display 1436, discussed further below. Input device 1432 may be utilized as a user selection device for selecting one or more graphical representations in a graphical interface as described above.

A user may also input commands and/or other information to computer system 1400 via storage device 1424 (e.g., a removable disk drive, a flash drive, etc.) and/or network interface device 1440. A network interface device, such as network interface device 1440 may be utilized for connecting computer system 1400 to one or more of a variety of networks, such as network 1444, and one or more remote devices 1448 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 1444, may employ a wired and/or a wireless mode of communication. In general, any network topology may be used. Information (e.g., data, software 1420, etc.) may be communicated to and/or from computer system 1400 via network interface device 1440.

Computer system 1400 may further include a video display adapter 1452 for communicating a displayable image to a display device, such as display device 1436. Examples of a display device include, but are not limited to, a liquid crystal display (LCD), a cathode ray tube (CRT), a plasma display, a light emitting diode (LED) display, and any combinations thereof. Display adapter 1452 and display device 1436 may be utilized in combination with processor 1404 to provide graphical representations of aspects of the present disclosure. In addition to a display device, a computer system 1400 may include one or more other peripheral output devices including, but not limited to, an audio speaker, a printer, and any combinations thereof. Such peripheral output devices may be connected to bus 1412 via a peripheral interface 1456. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments of the apparatus and method of the present invention, what has been described herein is merely illustrative of the application of the principles of the present invention. Moreover, where a "system" is identified as performing a step, any computing device, module, or other component of system may perform the step, and any specific performance by any such computing device, module, or other component is contemplated as within the scope of this disclosure. Additionally, although the methods herein have been illustrated as being performed in a specific order, the ordering is highly variable within ordinary skill to achieve the methods, systems, and software for hardware-component based geometric modifications of computer-modeled part designs described herein. Accordingly, this description is meant to be taken only by way of example, and not to otherwise limit the scope of this invention.

What is claimed is:

1. A method of providing a natural language interface for a computer-aided design (CAD) system, the method comprising:
   automatedly, via a computing device, displaying to the user a model display graphical user interface (GUI);
   automatedly, via the computing device, displaying to the user, in the model display GUI, a view window designed and configured to display a first view of a CAD model;
   automatedly, via the computing device, displaying to the user, in the model display GUI, a spectrum GUI designed and configured to allow the user to selectively add CAD-tool functionality to the model display GUI;
   automatedly, via the computing device, receiving a user voice input comprising a plurality of words and directing the computing device to perform an action using a specific CAD-tool functionality of a plurality of CAD-tool functionalities, wherein the user voice input does not include an instruction to activate the specific CAD-tool functionality;
   automatedly, via the computing device, parsing the user voice input;
   automatedly, via the computing device, identifying a command for the spectrum GUI to perform the action using the specific CAD-tool functionality based on the plurality of words, wherein identifying the command for the spectrum GUI to perform the action further comprises:
      automatedly, via the computing device, determining a meaning for the parsed user voice input, the meaning including a reference to the specific CAD-tool functionality;
      automatedly, via the computing device, assembling a query for additional information based on the meaning;
      automatedly, via the computing device, sending the assembled query to a corresponding information location;
      automatedly, via the computing device, receiving queried information from the corresponding information location;
      automatedly, via the computing device, translating received information into a response;
      automatedly, via the computing device, determining that the response includes the command for the spectrum GUI to perform the action using the specific CAD-tool functionality;
   automatedly, via the computing device, determining that the specific CAD-tool functionality is not currently activated in the Spectrum GUI;
   automatedly, via the computing device, sending a command to the Spectrum GUI to activate the specific CAD tool; and
   automatedly, via the computing device, sending the command to perform the action using the particular CAD-tool functionality to the spectrum GUI.

2. The method of claim 1, wherein determining the meaning for the parsed user voice input further comprises determining one or more words associated with one or more program actions related to the specific CAD-tool functionality.

3. The method of claim 1, wherein determining the meaning for the parsed user voice input further comprises determining one or more command topics related to the specific CAD-tool functionality.

4. The method of claim 1, wherein determining that the response includes the command for the spectrum GUI regarding the specific CAD-tool functionality further comprises determining that the response is missing information and displaying to the user a prompt for missing information.

5. The method of claim 4 further comprising automatedly receiving, via the computing device, a response from the user to the prompt for missing information.

6. The method of claim 5, wherein providing the command to the spectrum GUI further comprises providing the command based on the additional information and the response from the user to the prompt for missing information.

7. The method of claim 1 further comprising:
   determining that the user is authorized to access the specific CAD-tool functionality; and
   automatedly activating the specific CAD-tool functionality.

8. The method of claim 1 further comprising displaying to the user a message indicating that the specific CAD-tool functionality is not currently activated.

9. The method of claim 1, wherein the command to perform an action using the specific CAD-tool functionality further comprises a command to modify the first view using a viewing tool.

10. The method of claim 1, wherein the command to perform an action using the specific CAD-tool functionality further comprises a command to modify the CAD model using the CAD manipulation tool.

11. The method of claim 10, further comprising automatedly receiving, via an input device of a computing device, a user selection of a particular location of the displayed first view of the CAD model.

12. The method of claim 11, wherein receiving the voice input further comprises receiving a reference to a specific item.

13. The method of claim 12, further comprising automatedly, via the computing device and based on the determined meaning, identifying information comprising two or more specifications for the specific item via a CAD context database, wherein the specifications comprise two or more of: a diameter, a length, a depth, a thickness, and a material.

14. The method of claim 13, wherein assembling the query further comprises assembling a query for additional information based on the meaning, the identified information, and the CAD model.

15. The method of claim 12 further comprising prompting the user for missing information determined as a function of the additional information based on whether the specific item is compatible with one or more aspects of the CAD model when placed at the particular location.

16. The method of claim 10 further comprising automatedly, via the computing device, updating the view window with respect to the CAD model based on the command.

* * * * *